United States Patent
Okuno et al.

(10) Patent No.: US 8,518,806 B2
(45) Date of Patent: Aug. 27, 2013

(54) METHOD FOR PRODUCING GROUP III NITRIDE-BASED COMPOUND SEMICONDUCTOR, WAFER INCLUDING GROUP III NITRIDE-BASED COMPOUND SEMICONDUCTOR, AND GROUP III NITRIDED-BASED COMPOUND SEMICONDUCTOR DEVICE

(75) Inventors: Koji Okuno, Aichi-ken (JP); Shugo Nitta, Aichi-ken (JP); Yoshiki Saito, Aichi-ken (JP); Yasuhisa Ushida, Aichi-ken (JP); Naoyuki Nakada, Kiyosu (JP); Shinya Boyama, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 94 days.

(21) Appl. No.: 12/734,685

(22) PCT Filed: Jan. 27, 2009

(86) PCT No.: PCT/JP2009/051681
§ 371 (c)(1),
(2), (4) Date: May 17, 2010

(87) PCT Pub. No.: WO2009/096578
PCT Pub. Date: Aug. 6, 2009

(65) Prior Publication Data
US 2010/0308437 A1  Dec. 9, 2010

(30) Foreign Application Priority Data

Jan. 29, 2008 (JP) ................. 2008-017543
Aug. 21, 2008 (JP) ................. 2008-212461

(51) Int. Cl.
*H01L 29/20* (2006.01)
*H01L 21/20* (2006.01)

(52) U.S. Cl.
USPC ............. 438/479; 257/E21.09; 257/E29.089; 438/481

(58) Field of Classification Search
USPC ................... 257/E21.09, E29.089; 438/479, 438/481
See application file for complete search history.

(56) References Cited

U.S. PATENT DOCUMENTS 5,242,857 A    9/1993 Cooper et al.
(Continued)

FOREIGN PATENT DOCUMENTS

JP    2708165 B2    2/1998
(Continued)

OTHER PUBLICATIONS

Gonda et al., Improvements on the electrical and luminescent properties of reactive molecular bem epitaxially grown GaN flsm by using AIN-coated sapphire substrates, Applied Physics Letters, vol. 42(5), Mar. 1983.*

(Continued)

*Primary Examiner* — Peniel M Gumedzoe
(74) *Attorney, Agent, or Firm* — McGinn Intellectual Property Law Group, PLLC

(57) ABSTRACT

To produce a Group III nitride-based compound semiconductor having a m-plane main surface and uniformly oriented crystal axes.

A mesa having a side surface having an off-angle of 45° or less from c-plane is formed in a a-plane main surface of a sapphire substrate. Subsequently, trimethylaluminum is supplied at 300° C. to 420° C., to thereby form an aluminum layer having a thickness of 40 Å or less. The aluminum layer is nitridated to form an aluminum nitride layer. Through the procedure, a Group III nitride-based compound semiconductor is epitaxially grown only from a side surface of the mesa having an off-angle of 45° or less from c-plane in the sapphire substrate having an a-plane main surface. Thus, a Group III nitride-based compound semiconductor having m-plane which is parallel to the main surface of the sapphire substrate can be formed.

29 Claims, 21 Drawing Sheets

(56) References Cited

U.S. PATENT DOCUMENTS

| | | | |
|---|---|---|---|
| 6,683,327 B2 | 1/2004 | Krames et al. | |
| 6,864,160 B2 * | 3/2005 | Linthicum et al. | 438/479 |
| 6,967,122 B2 | 11/2005 | Tezen | |
| 7,250,638 B2 | 7/2007 | Lee et al. | |
| 7,462,867 B2 | 12/2008 | Tezen | |
| 7,462,881 B2 | 12/2008 | Lee et al. | |
| 7,563,629 B2 | 7/2009 | Lee et al. | |
| 7,569,865 B2 | 8/2009 | Lee et al. | |
| 7,576,368 B2 | 8/2009 | Lee et al. | |
| 7,588,952 B2 | 9/2009 | Lee et al. | |
| 7,816,705 B2 | 10/2010 | Lee et al. | |
| 7,928,465 B2 | 4/2011 | Lee et al. | |
| 8,084,281 B2 | 12/2011 | Shibata et al. | |
| 8,384,120 B2 | 2/2013 | Lee et al. | |
| 2001/0041427 A1 | 11/2001 | Gehrke et al. | |
| 2003/0162340 A1 | 8/2003 | Tezen | |
| 2003/0189215 A1 | 10/2003 | Lee et al. | |
| 2005/0098792 A1 | 5/2005 | Lee et al. | |
| 2006/0060866 A1 | 3/2006 | Tezen | |
| 2006/0071230 A1 | 4/2006 | Lee et al. | |
| 2006/0099730 A1 | 5/2006 | Lee et al. | |
| 2006/0244001 A1 | 11/2006 | Lee et al. | |
| 2007/0295986 A1 | 12/2007 | Lee et al. | |
| 2008/0001166 A1 | 1/2008 | Lee et al. | |
| 2008/0048195 A1 | 2/2008 | Okuyama et al. | |
| 2008/0308836 A1 | 12/2008 | Nakahara et al. | |
| 2009/0278161 A1 | 11/2009 | Lee et al. | |
| 2010/0289122 A1 | 11/2010 | Vaudo et al. | |
| 2010/0308368 A1 | 12/2010 | Lee et al. | |
| 2011/0193128 A1 | 8/2011 | Lee et al. | |
| 2012/0064653 A1 | 3/2012 | Nakahara et al. | |
| 2012/0098102 A1 | 4/2012 | Imer et al. | |

FOREIGN PATENT DOCUMENTS

| | | |
|---|---|---|
| JP | 10-335702 A | 12/1998 |
| JP | 2001-267242 A | 9/2001 |
| JP | 2002-8985 A | 1/2002 |
| JP | 2003-158294 | 5/2003 |
| JP | 2003-209062 | 7/2003 |
| JP | 2003-282551 A | 10/2003 |
| JP | 2005-522873 A | 7/2005 |
| JP | 2006-036561 | 2/2006 |
| JP | 2006-36561 | 2/2006 |
| JP | 2006-36561 A | 2/2006 |
| JP | 2006-054279 | 2/2006 |
| JP | 2006-54279 | 2/2006 |
| JP | 2006-165070 A | 6/2006 |
| JP | 2007-214251 | 8/2007 |
| TW | 200539488 | 12/2005 |
| TW | I259513 | 8/2006 |
| TW | 200703463 A | 1/2007 |
| TW | 200711165 A | 3/2007 |
| TW | 200723563 A | 6/2007 |
| TW | 200741044 | 11/2007 |
| WO | WO 01/69662 A1 | 9/2001 |
| WO | WO 03/088318 A2 | 10/2003 |
| WO | WO 03/088318 A3 | 10/2003 |

OTHER PUBLICATIONS

Appl. Phys. Lett., Jul. 13, 2007, vol. 91, pp. 021914-1-021914-3.
International Search Report.
Chinese Office Action dated Mar. 29, 2012, with English translation.
"Dislocation reduction in GaN grown on stripe patterned r-plane sapphire substrates", Hou-Guang Chen, etc., Applied Physics Letter, vol. 91, Issue 2, pp. 021914-1 to 021914-2, Jul. 13, 2007.
Taiwanese Office Action dated May 17, 2012, with English translation.
Korean Office Action dated Sep. 29, 2011, with partial English translation.
Chen, et al., "Dislocation reduction in GaN grown on stripe patterned r'plane sapphire substrates", Applied Physics Letters 91, 021914-1 to 021914-3 (2007).
International Search Report dated May 19, 2009.
Hou-Guang Chen et. al, "Dislocation Reduction in GaN grown on stripe patterned r-plane sapphire substrates", Applied physics letters 91.021914 (2007), pp. 021914-1 to 021914-3 (Previously Submitted).
Office Action dated Feb. 5, 2013 in U.S. Appl. No. 12/654,562.
Japanese Office Action (No. 2009-293463) dated Feb. 19, 2013 with Englisth translation.
Japanese Office Action (No. 2009-293464) dated Feb. 19, 2013 with English translation.
Japanese Office Action (No. 2008-212461) dated Mar. 12, 2013 with English translation.
Hou-Guang Chen et. al. "Dislocation reduction in GaN grown on stripe patterned r-plane sapphire substrates", Applied Physics Letters, 91, 021914 (2007), pp. 021914-1-021914-3 (Previously Submitted).

* cited by examiner

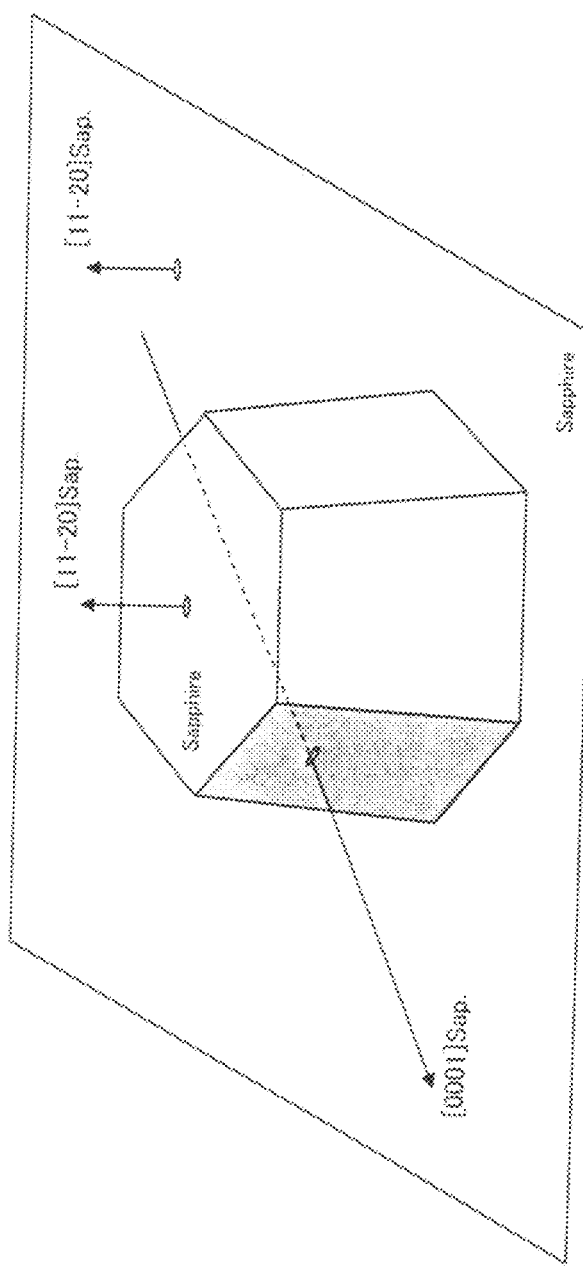
Fig. 1.A

Fig. 1.B
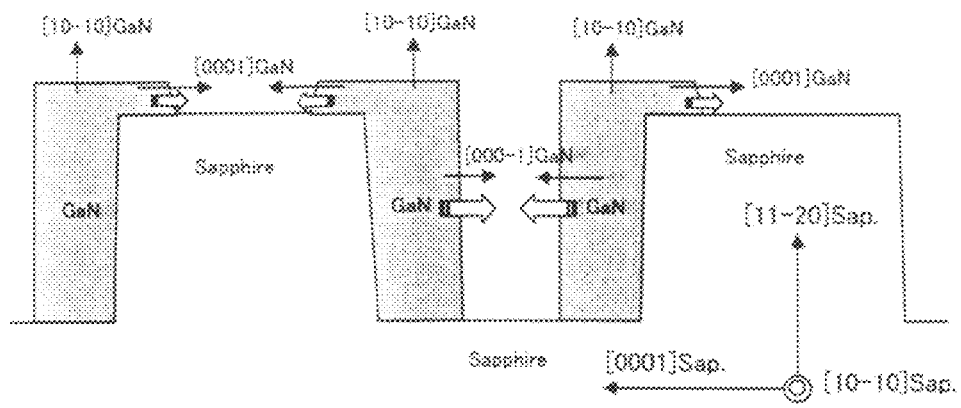
Fig. 1.C
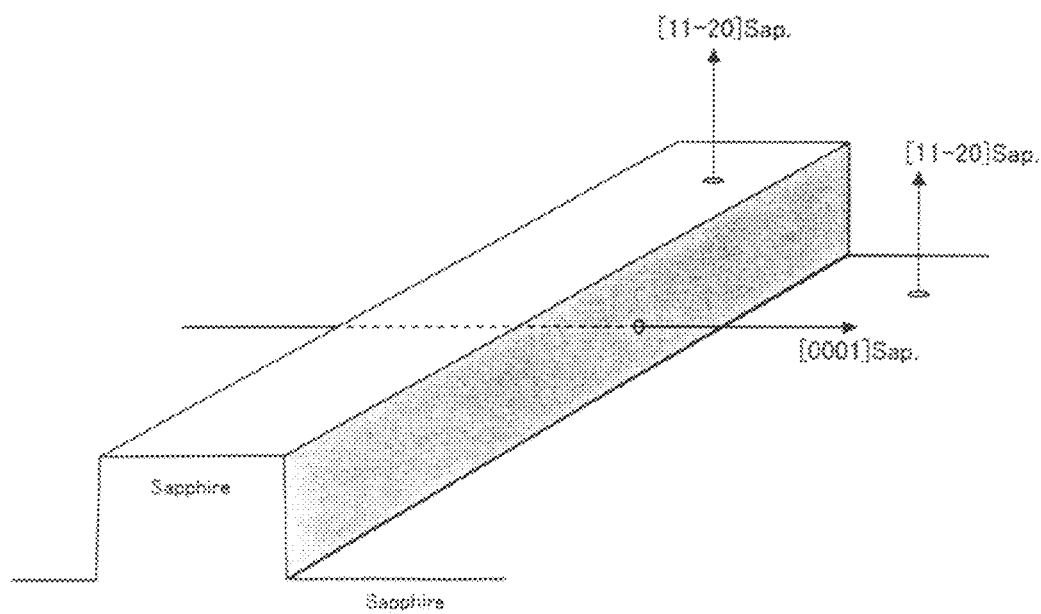

Fig. 1.D
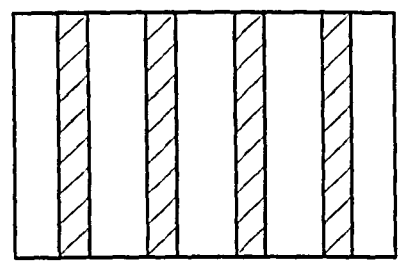
Fig. 1.E
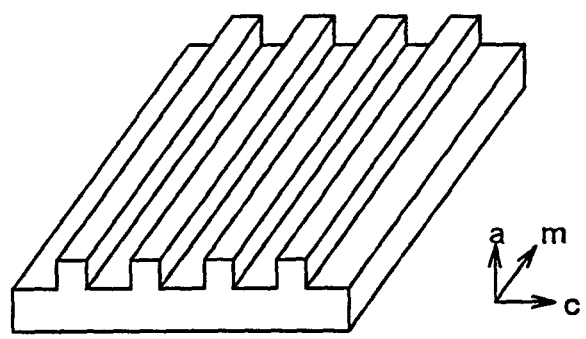
Fig. 1.F
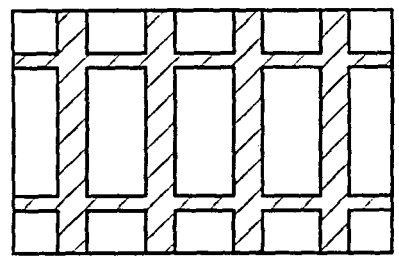
Fig. 1.G
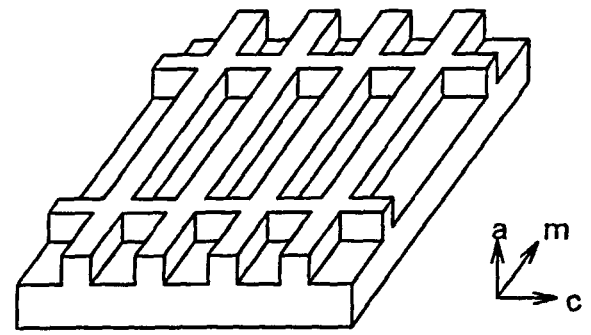

Fig. 1.H
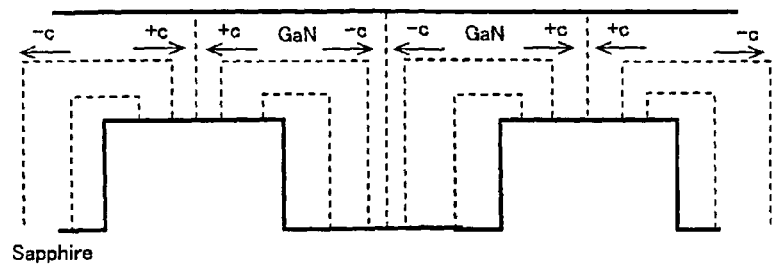
Fig. 1.I
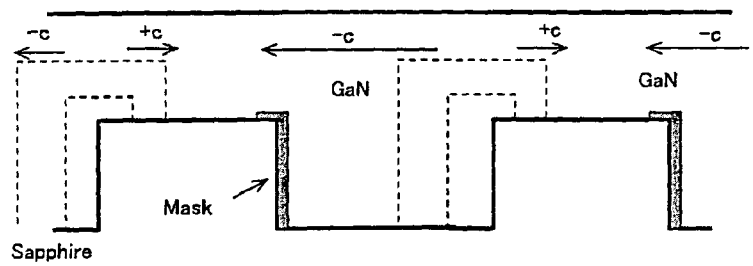
Fig. 1.J
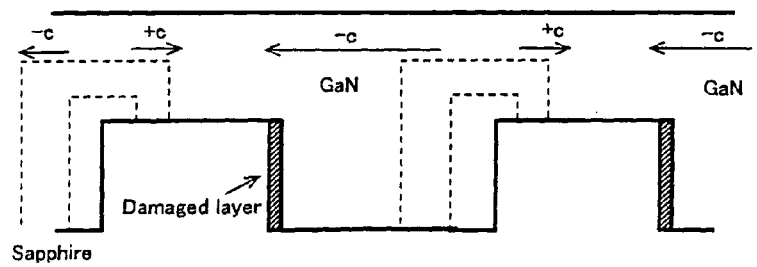

Fig. 1.K
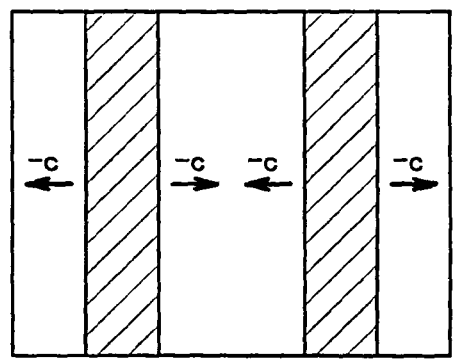
Fig. 1.L
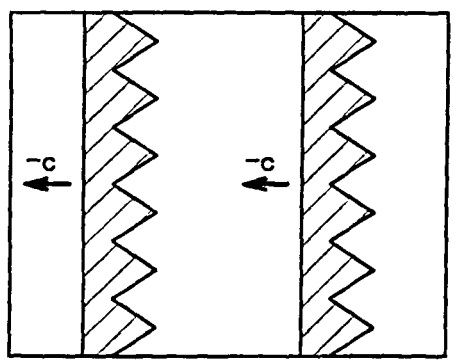

Fig. 3.A
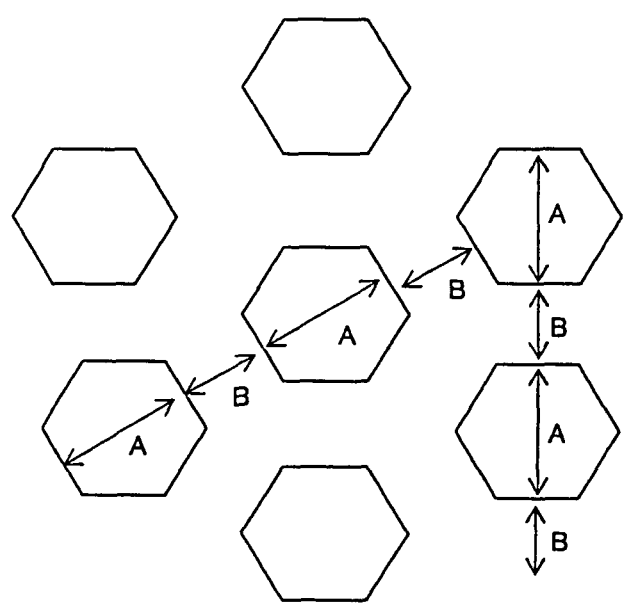

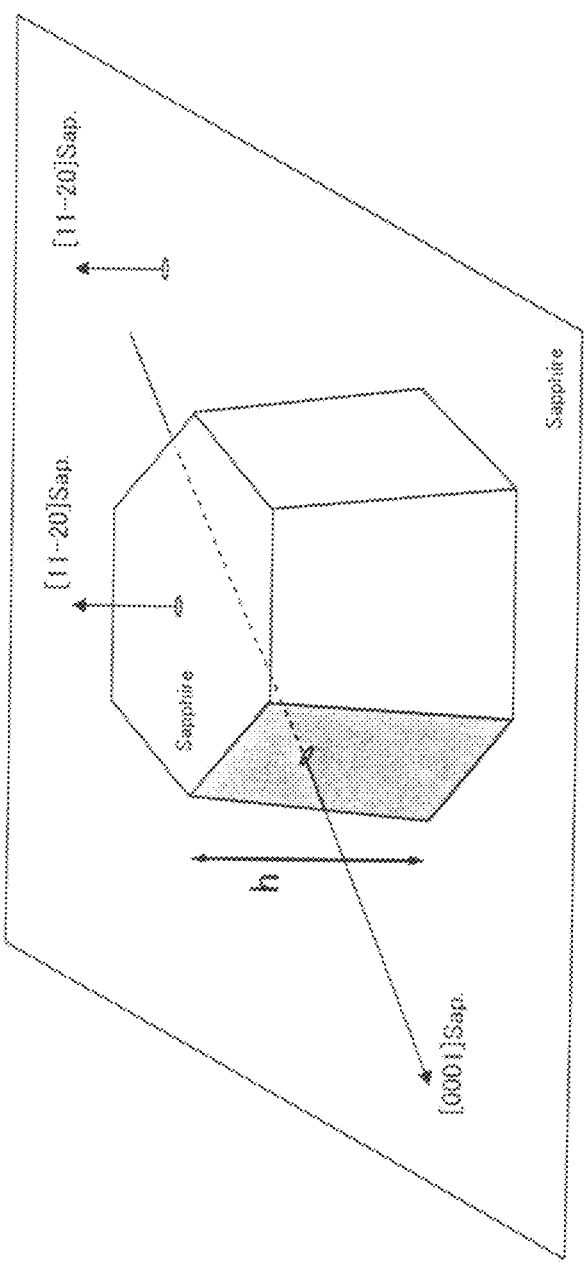
Fig. 3.B

Fig. 4.A
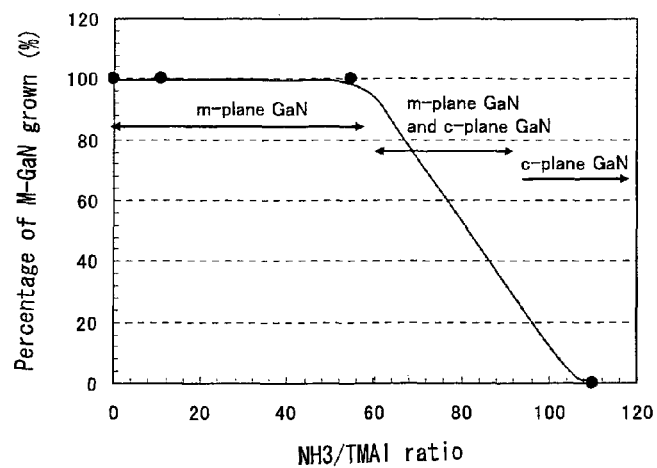
Fig. 4.B
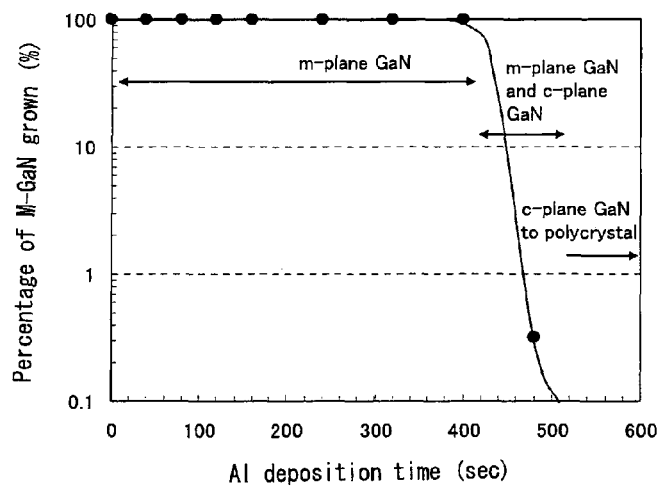
Fig. 4.C
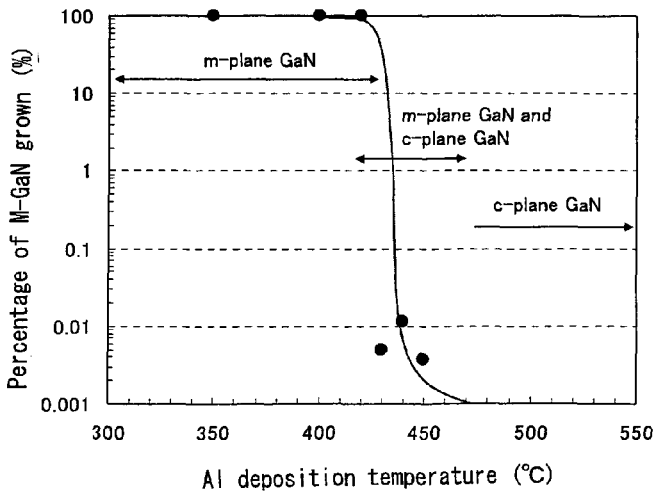

Fig. 5.A
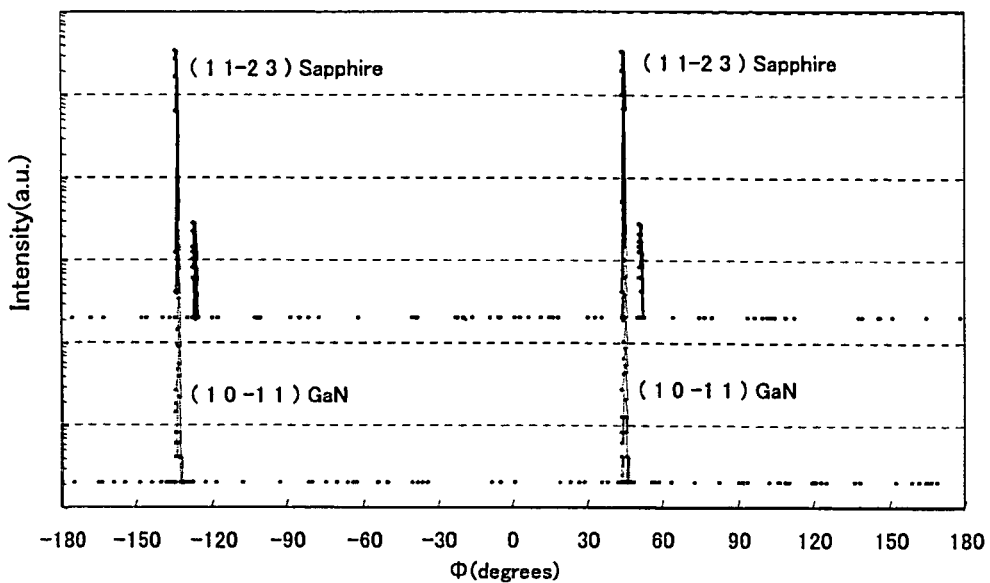
Fig. 5.B
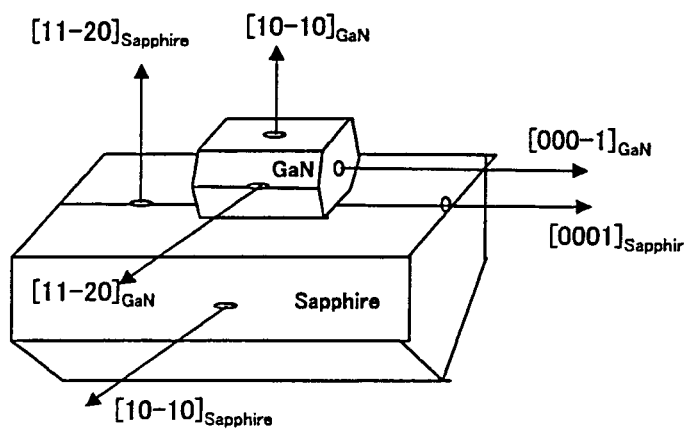

METHOD FOR PRODUCING GROUP III NITRIDE-BASED COMPOUND SEMICONDUCTOR, WAFER INCLUDING GROUP III NITRIDE-BASED COMPOUND SEMICONDUCTOR, AND GROUP III NITRIDED-BASED COMPOUND SEMICONDUCTOR DEVICE

TECHNICAL FIELD

The present invention relates to a method for producing a Group III nitride-based compound semiconductor having a so-called wurtzite structure. More particularly, the present invention relates to a method for producing, through epitaxial growth, a Group III nitride-based compound semiconductor having an m-plane main surface.

As used herein, "Group III nitride-based compound semiconductor" encompasses a semiconductor represented by the formula $Al_xGa_yIn_{1-x-y}N$ ($0 \leq x \leq 1$, $0 \leq 1$, $0 \leq x+y \leq 1$); such a semiconductor containing a predetermined element so as to attain, for example, an n-type/p-type conduction; and such a semiconductor in which a portion of a Group III element is substituted by B and/or Ti, and/or a portion of the Group V element is substituted by P, As, Sb, and/or Bi.

BACKGROUND ART

Group III nitride-based compound semiconductor light-emitting devices have been widely used, and many attempts have been made to improve characteristics of the devices. In general, a Group III nitride-based compound semiconductor light-emitting device is produced through epitaxial growth of a Group III nitride-based compound semiconductor on a substrate made of a material different from a Group III nitride-based compound semiconductor (hereinafter the substrate may be referred to as a "hetero-substrate"); for example, a sapphire substrate. In a most common epitaxial growth process, a Group III nitride-based compound semiconductor is grown so that the thickness direction of the semiconductor is along the c-axis, and the semiconductor has a c-plane main surface.

As has been known, when, in a Group III nitride-based compound semiconductor light-emitting device, for example, layers having a multiple quantum well structure are stacked in a c-axis direction (i.e., the interface between stacked layers is parallel to c-plane), a piezoelectric field is generated by strain in the light-emitting device, and quantum efficiency is reduced. Generation of such a piezoelectric field attributed to internal strain is also undesirable in the case of formation of a device other than a light-emitting device (e.g., HEMT).

In view of the foregoing, attempts have been made to develop a technique for epitaxially growing a Group III nitride-based compound semiconductor so that the thickness direction of the semiconductor is not along the c-axis.

Patent Document 1: Japanese Patent Application Laid-Open (kokai) No. 2006-036561

Non-Patent Document 1: Koji Okuno, et al., Technical Report of The Institute of Electronics, Information and Communication Engineers ED 2002-20

DISCLOSURE OF THE INVENTION

Problems to be Solved by the Invention

Patent Document 1 discloses a technique for preventing growth of a crystal in an undesirable growth axis direction through formation of a mask. A technique disclosed in Non-Patent Document 1 fails to prevent growth of a crystal in an undesirable growth axis direction. The present inventors have accomplished the present invention through application and improvement of the technique disclosed in Non-Patent Document 1.

Means for Solving the Problems

In a first aspect of the present invention, there is provided a method for producing a Group III nitride-based compound semiconductor, comprising thermally treating a main surface of a substrate, the main surface having thereon a mesa having at least an inclined side surface; forming an aluminum nitride thin film on the surface of the substrate having a the mesa through nitridation under supply of ammonia; and epitaxially growing a Group III nitride-based compound semiconductor primarily on the side surface of the mesa of the substrate.

In a second aspect of the present invention, the substrate is a sapphire substrate having an m-plane main surface; the mesa has a side surface other than the main surface; and a line formed by the side surface and the main surface is inclined, in m-plane of the sapphire substrate, from the a-axis toward a c-axis direction by 15° to 90°.

In a third aspect of the present invention, the substrate is a sapphire substrate having a c-plane main surface, and the mesa has a side surface other than the main surface.

In a fourth aspect of the present invention, there is provided a method for producing a Group III nitride-based compound semiconductor, comprising thermally treating an a-plane main surface of a sapphire substrate, the main surface having thereon a mesa having at least a side surface having an off-angle of 45° or less from c-plane (as used herein, the term "off" refers to the case where a surface is inclined from a crystal plane); forming an aluminum nitride thin film on the surface having a mesa through nitridation under supply of ammonia; and epitaxially growing a Group III nitride-based compound semiconductor primarily on the side surface of the mesa having an off-angle of 45° or less from c-plane, to thereby form a Group III nitride-based compound semiconductor layer having an m-plane main surface which is parallel to the a-plane surface of the sapphire substrate.

In a fifth aspect of the present invention, among the side surfaces of the mesa, one of two side surfaces having different normal vectors is covered with a material which does not permit easy epitaxial growth of a Group III nitride-based compound semiconductor.

In a sixth aspect of the present invention, among the side surfaces of the mesa, one of two side surfaces having different normal vectors is treated to have embossment or roughness so that epitaxial growth of a Group III nitride-based compound semiconductor on the treated side surface does not proceed easily. In this case, formation of embossment or roughness on one of two side surfaces having different normal vectors may be performed after formation of the side surface through, for example, etching. Alternatively, such a side surface that has embossment or roughness may be initially formed.

In a seventh aspect of the present invention, mesas are arranged in a stripe form as viewed from above.

In an eighth aspect of the present invention, mesas are arranged in a lattice form as viewed from above.

In a ninth aspect of the present invention, in the thermal treatment, an aluminum thin film having a thickness of 1 Å to 40 Å is formed through supply of aluminum or an aluminum compound.

In a tenth aspect of the present invention, the aluminum thin film is formed through supply of trimethylaluminum.

In an eleventh aspect of the present invention, the aluminum thin film is formed at 300° C. to 420° C.

In a twelfth aspect of the present invention, the thermal treatment involves heating to a predetermined temperature of 900° C. to 1,200° C. and maintaining the predetermined temperature for 20 minutes or shorter in a hydrogen atmosphere.

In a thirteenth aspect of the present invention, the thermal treatment does not involve supply of ammonia or a reactive nitrogen compound which can serve as a nitrogen source for a Group III nitride-based compound semiconductor.

In a fourteenth aspect of the present invention, there is provided a wafer comprising a sapphire substrate having thereon a mesa having a side surface which differs from a main surface of the substrate and on which a Group III nitride-based compound semiconductor is grown more readily than on the main surface; and a Group III nitride-based compound semiconductor which is epitaxially grown on the side surface and has a main surface having a crystal orientation of interest.

In a fifteenth aspect of the present invention, there is provided a wafer comprising a sapphire substrate having an a-plane main surface, and a Group III nitride-based compound semiconductor which has an m-plane main surface and is formed on the sapphire substrate, wherein, between the sapphire substrate and the Group III nitride-based compound semiconductor, there is no such a film that is made of a material other than Group III nitride-based compound semiconductor.

In a sixteenth aspect of the present invention, there is provided a wafer comprising a sapphire substrate having an a-plane main surface, and a Group III nitride-based compound semiconductor which has an m-plane main surface and is formed on the sapphire substrate, wherein, on at least a portion of the a-plane main surface of the sapphire substrate between the sapphire substrate and the Group III nitride-based compound semiconductor, there is no such a film that is made of a material other than Group III nitride-based compound semiconductor.

A seventeenth aspect of the present invention is drawn to a specific embodiment of the wafer as described in any one of the fourteenth to sixteenth aspects of the invention, wherein the substrate is processed to have a mesa so that a surface other than the main surface is formed, and the Group III nitride-based compound semiconductor is in contact with at least a portion of the surface other than the main surface.

In an eighteenth aspect of the present invention, there is provided a Group III nitride-based compound semiconductor device which is produced by forming a device element on a wafer as recited in any one of the fourteenth to seventeenth aspects of the invention, followed by division of the resultant product.

Effects of the Invention

Patent Document 1 discloses a technique in which, for example, mesas having a desired crystal growth surface are formed on a hetero-substrate (e.g., sapphire substrate) having a predetermined main surface; the surfaces other than the crystal growth surface are covered so that crystal growth does not occur on the surfaces; and, for example, a Group III nitride-based compound semiconductor is epitaxially grown so that the c-axis direction of the semiconductor is in a direction perpendicular to the crystal growth surface of the hetero-substrate; i.e., a desired axis-direction of the semiconductor is in a direction perpendicular to the main surface of the hetero-substrate.

Studies by the present inventors have shown that the technique disclosed in Non-Patent Document 1 merely allows epitaxial growth of a Group III nitride-based compound semiconductor on a sapphire substrate so that both c-plane and m-plane of the semiconductor are parallel to the main surface of the substrate.

Further studies by the present inventors have shown that when an aluminum thin film is formed on an a-plane main surface of a sapphire substrate having thereon a mesa having at least a side surface having an off-angle of 45° or less from c-plane, and then nitridation is carried out under optimized conditions, a Group III nitride-based compound semiconductor is formed so that m-plane of the semiconductor is parallel to the main surface of the sapphire substrate (fourth aspect).

Next will be described the mechanism of epitaxial growth through the aforementioned steps of the method provided by the present inventors.

FIGS. 1.A and 1.B show features of epitaxial growth carried out in the embodiments described hereinbelow. The mechanism of epitaxial growth will now be described with reference to FIGS. 1.A and 1.B. As shown in FIG. 1.A, hexagonal columnar (truncated hexagonal pyramidal) mesas are provided on an a-plane main surface of a sapphire substrate at appropriate intervals. FIG. 1.A shows the case where only one mesa is provided. As shown in FIG. 1.A, the hexagonal columnar (truncated hexagonal pyramidal) mesa has two side surfaces having an off-angle of 45° or less from c-plane (i.e., the gray side surface and the surface opposite thereto). The remaining side surfaces of the hexagonal columnar (truncated hexagonal pyramidal) mesa are not parallel or perpendicular to c-plane; i.e., the side surfaces are not c-plane, m-plane, or a-plane.

Studies by the present inventors have shown that when an aluminum thin film (thickness: 40 Å or less) is formed on a sapphire substrate having an a-plane main surface and having thereon a hexagonal columnar (truncated hexagonal pyramidal) mesa as shown in FIG. 1.A, and then the aluminum thin film is converted to an AlN film through nitridation, followed by epitaxial growth of a Group III nitride-based compound semiconductor, epitaxial growth of the semiconductor primarily occurs on the side surfaces of the mesa having an off-angle of 45° or less from c-plane so that the c-axis of the sapphire substrate corresponds to the c-axis of the semiconductor. In this case, rapid growth of the semiconductor does not occur on the remaining side surfaces of the mesa of the sapphire substrate, the a-plane top surface of the mesa of the sapphire substrate, or the non-mesa region of the sapphire substrate.

Thus, epitaxial growth of the Group III nitride-based compound semiconductor primarily occurs on the side surfaces of the hexagonal columnar (truncated hexagonal pyramidal) mesa of the sapphire substrate having an off-angle of 45° or less from c-plane so that the c-axis of the sapphire substrate corresponds to the c-axis of the semiconductor; i.e., so-called epitaxial lateral overgrowth (ELO) proceeds so that the semiconductor covers the entire main surface of the sapphire substrate. In this case, epitaxial growth proceeds so that m-plane (or the line normal thereto (i.e., the m-axis)) of the Group III nitride-based compound semiconductor is parallel to the a-plane main surface (or the line normal thereto (i.e., the a-axis)) of the sapphire substrate (FIG. 1.B). As shown in FIG. 1.B, axes of the Group III nitride-based compound semiconductor are denoted by the symbol "GaN," and axes of the sapphire substrate are denoted by the symbol "Sap." This phenomenon matches the known fact that when a Group III nitride-based compound semiconductor is epitaxially grown on a sapphire substrate having a c-plane main surface, the a-axis direction of the sapphire substrate coincides with the m-axis direction of the Group III nitride-based compound semiconductor.

Alternatively, a mesa as shown in FIG. 1.C may be formed. The mesa shown in FIG. 1.C has a stripe form as viewed from above. The top and bottom surfaces of the mesa are a-plane of the sapphire substrate, and the side surfaces of the mesa are only c-plane.

As shown in FIG. 1.B, growth of the Group III nitride-based compound semiconductor on side surfaces of mesas proceeds in a −c direction, and the growth surface of the semiconductor is −c-plane. This is based on the fact that when a growing Group III nitride-based compound semiconductor is immersed in an alkali solution, the growth surface of the semiconductor is very likely to be etched.

For formation of a mesa, for example, dry etching is preferably performed by use of an etching mask.

When dry etching is carried out by use of an etching mask shown in the plan view of FIG. 1.D (hatched portions), as shown in FIG. 1.E, a substrate having mesas arranged in a stripe form as viewed from above (hereinafter the mesas may be referred to as "stripe-form mesas") is formed (seventh aspect).

When dry etching is carried out by use of an etching mask shown in the plan view of FIG. 1.F (hatched portions), as shown in FIG. 1.G, a substrate having mesas arranged in a lattice form as viewed from above is formed (eighth aspect).

In a sapphire substrate shown in FIG. 1.E, all the side surfaces of the stripe-form mesas are c-plane. When a Group III nitride-based compound semiconductor light-emitting device is formed on the sapphire substrate having the form shown in FIG. 1.E, due to the form of the mesas of the substrate, light extraction performance by refraction of light at the interface between the substrate and a Group III nitride-based compound semiconductor layer is lower than that in the case where a Group III nitride-based compound semiconductor light-emitting device is formed on the sapphire substrate having the form shown in FIG. 1.A. This is because, as shown in FIG. 1.E, the mesas have only surfaces parallel to the m-axis, which is parallel to the a-plane main surface of the substrate, and thus a component of emitted light in an m-axis direction is not affected (in terms of refraction) at all by the mesas. For improvement of light extraction performance, preferably, as shown in FIG. 1.G, the substrate is processed to have mesas arranged in a lattice form as viewed from above. In this case, a Group III nitride-based compound semiconductor is not epitaxially grown on m-plane side surfaces of the mesa. Therefore, preferably, lateral portions of the etching mask shown in FIG. 1.F are thinned, and the number of the portions is reduced, so as to suppress reduction in area of c-plane side surfaces of a mesa which is to be formed on a sapphire substrate having an a-plane main surface.

A Group III nitride-based compound semiconductor having an m-plane main surface can be formed on a substrate having only the aforementioned mesas. However, when a Group III nitride-based compound semiconductor is grown on all the c-plane side surfaces of mesas of a sapphire substrate, discontinuous surfaces are formed. Specifically, as shown in the cross-sectional view of FIG. 1.H, Group III nitride-based compound semiconductors are epitaxially grown, in an −c-axis direction, on the c-plane side surfaces of opposing mesas of a sapphire substrate, and thus the junction interface between the thus-grown Group III nitride-based compound semiconductors forms a discontinuous surface. In FIGS. 1.H to 1.L, side surfaces of mesas of a sapphire substrate are slightly off c-plane. However, for the sake of simple description, the side surfaces may be hereinafter referred to as "c-plane surfaces."

As shown in the cross-sectional view of FIG. 1.I, among the side surfaces of mesas of a sapphire substrate, preferably, c-plane surfaces whose normal vectors are oriented in the same direction are caused to remain as is, and c-plane surfaces whose normal vectors are oriented in a direction opposite thereto are masked with a material on which epitaxial growth of a Group III nitride-based compound semiconductor does not occur. In this case, all the unmasked c-plane surfaces have normal vectors oriented in the same direction, and thus Group III nitride-based compound semiconductors are epitaxially grown on the c-plane surfaces in a −c direction. Therefore, a discontinuous surface is not formed by the junction interface between the Group III nitride-based compound semiconductors epitaxially grown on the c-plane surfaces of different mesas of the sapphire substrate.

Preferably, as shown in the cross-sectional view of FIG. 1.J, among the side surfaces of mesas of a sapphire substrate, c-plane surfaces whose normal vectors are oriented in the same direction are caused to remain as is, and c-plane surfaces whose normal vectors are oriented in a direction opposite thereto are treated to form a rough surface or embossment to such an extent that a Group III nitride-based compound semiconductor is not epitaxially grown on the treated surfaces. In this case, all the untreated (e.g., unroughened) c-plane surfaces have normal vectors oriented in the same direction, and thus Group III nitride-based compound semiconductors are epitaxially grown on the c-plane surfaces in a −c direction. Therefore, a discontinuous surface is not formed by the junction interface between the Group III nitride-based compound semiconductors epitaxially grown on the c-plane surfaces of different mesas of the sapphire substrate.

Preferably, when, for example, an etching mask shown in FIG. 1.K is employed, mesas having a simple stripe form in plan view as shown in FIG. 1.E are formed, and surfaces whose normal vectors are oriented in directions separated by about 180° are formed. In contrast, employment of an etching mask shown in FIG. 1.L forms both side surfaces whose normal vectors are oriented in the same direction, and side surfaces on which, due to embossment, epitaxially growth does not occur, epitaxially growth proceeds very slowly, or miscellaneous crystals are grown.

Furthermore, according to the present inventors' finding, when stripe-form mesas are formed on a sapphire substrate having an m-plane main surface so that side surfaces of the stripe-form mesas have a specific plane index on the basis of the design of the longitudinal crystal orientation of the mesas, the main surface of a Group III nitride-based compound semiconductor which is epitaxially grown on the side surfaces and then entirely covers the mesas through lateral growth assumes m-plane or r-plane ((10-12) plane) parallel to the m-plane surface of the sapphire substrate, or m-plane which is slightly off the m-plane surface of the sapphire substrate.

Studies by the present inventors have shown that the epitaxially grown surface of the Group III nitride-based compound semiconductor is not perpendicular to m-plane, and therefore, on opposite side surfaces of a pair of stripe-form mesas, epitaxial growth of the Group III nitride-based compound semiconductor does not occur, or otherwise epitaxial growth proceeds very slowly (second aspect).

Furthermore, according to the present inventors' finding, when stripe-form mesas are formed on a sapphire substrate having a c-plane main surface on the basis of the design of the longitudinal crystal orientation of the mesas, the main surface of a Group III nitride-based compound semiconductor which is epitaxially grown on the side surfaces and then entirely covers the mesas through lateral growth assumes m-plane or a-plane parallel to the c-plane surface of the sapphire substrate (third aspect).

Thus, the present invention has been achieved on the basis of a broad technical concept of providing mesas are provided on a substrate so that surfaces having a crystal orientation different from that of the main surface of the substrate are formed, and epitaxially growing a Group III nitride-based compound semiconductor not on the substrate main surface or undesirable side surfaces of the mesas but on predetermined side surfaces of the mesas (first aspect). There are various reasons why epitaxial growth on the predetermined side surfaces of the mesas dominates epitaxial growth on the other surfaces. For example, no epitaxial growth occurs or epitaxial growth proceeds very slowly on the other surfaces, since the predetermined side surfaces are provided so, that epitaxial growth does not occur or is less likely to occur on the surfaces other than the predetermined side surfaces, or since, as described below, the selectivity of epitaxial growth is considerably improved through a technique, such as thermal treatment or nitridation of a sapphire substrate surface. In the embodiments described hereinbelow, a sapphire substrate is employed. However, the present invention is also applicable to a substrate made of a material other than sapphire (at least a substrate of hexagonal crystal form). For example, the present invention is applicable to a spinel or SiC substrate.

The aforementioned phenomena can be understood on the basis of the difference in surface energy between the predetermined side surfaces of the mesas and the other surfaces, or on the basis of the diffusion length, in the vicinity of the substrate surface, of the raw materials (chemical species) of a crystal or Group III nitride-based compound semiconductor epitaxially grown on the predetermined side surfaces of the mesas.

When an aluminum thin film is formed on a substrate having mesas, followed by nitridation, epitaxial growth occurs on side surfaces of the mesas, and no epitaxial growth occurs on the main surface of the substrate, for, for example, the following reasons.

Through thermal treatment and nitridation according to the present invention, no epitaxial growth occurs on the main surface (smooth surface) of the substrate, but epitaxial growth occurs on the side surfaces (treated and non-smooth surfaces). Conceivably, the treated side surfaces are more roughened (e.g., the surfaces are uneven, curved, or have large surface roughness), as compared with the untreated surface or treated bottom surface. This is a possible reason why a Group III nitride-based compound semiconductor is likely to be grown selectively on the side surfaces. The present invention is carried out under conditions optimal for this selective growth.

The present invention can be effectively carried out simply through treatment of a sapphire substrate with high-temperature hydrogen gas. However, an aluminum metal layer may be formed on the substrate by intentionally supplying an aluminum source. Treatment of the sapphire substrate with high-temperature hydrogen gas is means for causing aluminum atoms present in the sapphire substrate to emerge through etching and reduction reaction, whereas supply of an aluminum source is means for newly adding aluminum atoms. The aluminum source is preferably an organic aluminum compound, particularly from the viewpoint of control of reaction with the sapphire substrate surface. Alkyl aluminum compounds (in particular, trimethylaluminum) are preferably employed. As shown in the experimental data given hereinbelow, the temperature for formation of an aluminum thin film and the thickness of the film are essential conditions for the present invention, and particularly preferred ranges thereof have been determined.

In the case where a sapphire substrate surface is treated with high-temperature hydrogen gas without supply of an aluminum source, more preferably, nitridation is carried out after, for example, the temperature of the substrate has been temporarily lowered to 300 to 420° C. after the hydrogen gas treatment. When a sapphire substrate is treated with high-temperature hydrogen gas, the substrate may be maintained at a target temperature for a predetermined period of time, or the substrate may be cooled immediately after achievement of the target temperature. In the latter case, the sapphire substrate is treated with high-temperature hydrogen gas for a certain period before or after the time when the target temperature is achieved.

Thus, according to the present invention, there is produced a wafer including a substrate and an epitaxially grown crystal, wherein the relationship in crystal orientation between the main surface of the substrate and the main surface of the crystal is different from the relationship in crystal orientation between the main surface of a simple flat substrate and the main surface of an epitaxially grown crystal, which relationship is obtained when a Group III nitride-based compound semiconductor is formed on the flat substrate after a simple surface treatment of the substrate or formation of a layer (e.g., a buffer layer) on the substrate (fourteenth aspect). Specifically, there is produced a wafer including a sapphire substrate having an a-plane main surface, and a Group III nitride-based compound semiconductor which has an m-plane main surface and is formed on the substrate via no masking material (fifteenth aspect); or a wafer including a sapphire substrate having an a-plane main surface, and a Group III nitride-based compound semiconductor which has an m-plane main surface and is formed on the sapphire substrate, wherein, between the substrate and the semiconductor, a masking material is provided to such an extent that the material does not entirely cover the a-plane main surface (sixteenth aspect). Such a wafer can be readily produced through, for example, the aforementioned production method by use of a substrate having mesas (seventeenth aspect). In the present invention, epitaxial growth does not necessarily occur on the entire predetermined surfaces of mesas, and, for example, voids may be present.

Employment of such a wafer can produce a Group III nitride-based compound semiconductor device including layers whose interface is parallel to m-plane or a plane which is slightly off m-plane. In such a semiconductor device, a piezoelectric field is not generated in a direction perpendicular to the interface between Group III nitride-based compound semiconductor layers. Therefore, the semiconductor device exhibits improved characteristics, as compared with a Group III nitride-based compound semiconductor device including layers whose interface is parallel to c-plane. For example, a light-emitting device including such a wafer is envisaged to exhibit improved light-emitting performance (eighteenth aspect).

BEST MODES FOR CARRYING OUT THE INVENTION

Next will be described embodiments in which gallium nitride is epitaxially grown as a Group III nitride-based compound semiconductor. Needless to say, a layer or thick film formed of a Group III nitride-based compound semiconductor other than gallium nitride may be readily provided on the thus-grown Group III nitride-based compound semiconductor. The present invention encompasses the thus-produced product.

Embodiment 1

FIG. 2 schematically shows a specific embodiment of the method for producing a Group III nitride-based compound semiconductor of the present invention, which shows the temperature of a substrate, and supply/non-supply of raw materials or a carrier gas (hydrogen). Step numbers are given at the bottom of FIG. 2.

In step 1, in a hydrogen atmosphere, a sapphire substrate is heated to 1,160° C. and then cooled to 300 to 420° C.

In step 2, while the substrate is maintained at 300 to 420° C., trimethylaluminum is introduced under supply of a carrier gas (nitrogen-hydrogen mixture).

In step 3, introduction of trimethylaluminum is stopped, and the temperature of the substrate is elevated to 1,010° C. under supply of a carrier gas (nitrogen-hydrogen mixture) and ammonia.

In step 4, epitaxial growth is carried out through introduction of trimethylgallium under supply of a carrier gas (nitrogen-hydrogen mixture) and ammonia.

In step 5, the temperature of the substrate is lowered to 300° C. or lower in an atmosphere of ammonia and nitrogen.

As described below, the experimental data obtained in the case where a nitrogen-hydrogen mixture was employed in steps 2 to 4 were similar to those obtained in the case where only nitrogen or hydrogen was employed as a carrier gas in steps 2 to 4.

FIG. 3 shows the form of a processed sapphire substrate having an a-plane main surface, the substrate being employed in Embodiment 1. By use of a mask having numerous regular hexagonal openings as shown in FIG. 3.A, the surface of the substrate is etched so that hexagonal columnar (truncated hexagonal pyramidal) mesas are formed. In this case, the distance between opposing sides of one hexagonal opening is represented by "A," and the distance between opposing sides of adjacent hexagonal openings is represented by "B." One of three straight lines parallel to the sides of a hexagonal opening is parallel to the m-axis of the sapphire substrate; i.e., perpendicular to the c-axis.

When the sapphire substrate having an a-plane main surface is etched by use of the mask shown in FIG. 3.A, as shown in FIG. 3.B, there are formed truncated hexagonal pyramidal mesas, each having slightly inclined side surfaces. In this case, a side surface of each mesa including a side of the hexagonal top surface of the mesa—which side is parallel to the m-axis of the sapphire substrate (i.e., perpendicular to the c-axis)—is slightly inclined from (off) c-plane of the sapphire substrate. The angle between the side surface and c-plane is 45° or less, and, in FIG. 3.B, the side surface is shown together with the c-axis of the sapphire substrate. The height of the mesa is represented by "h."

Firstly, a sapphire substrate having an a-plane main surface was etched by use of the mask shown in FIG. 3.A (distance A: 3 μm, distance B: 2 μm) so that numerous mesas as shown in FIG. 3.B (height h: 0.8 μm) were formed. Subsequently, through the procedure shown in FIG. 2, an aluminum thin film was formed; nitridation was carried out; and gallium nitride (thickness: 4 μm) was epitaxially grown. In this experiment, formation of the aluminum thin film and nitridation were carried out under the conditions described below.

For evaluation of the thus-formed gallium nitride as described below, the ratio by amount of a GaN crystal in which the surface parallel to the a-plane main surface of the sapphire substrate is m-plane (hereinafter the GaN crystal may be referred to simply as "m-GaN") to a GaN crystal in which the surface parallel to the a-plane main surface of the sapphire substrate is c-plane (hereinafter the GaN crystal may be referred to simply as "c-GaN") was determined, through X-ray diffractometry (2θ scan), on the basis of the ratio of diffracted X-ray intensity associated with interference between m-plane surfaces to diffracted X-ray intensity associated with interference between c-plane surfaces.

1. Whether or Not Ammonia is to Be Present:

A test was carried out to determine whether or not ammonia is to be present at the time when trimethylaluminum is supplied. The ratio by mole of ammonia to trimethylaluminum (V/III ratio) was varied (0, 10, 60, or 110), and the thus-formed gallium nitride was evaluated in terms of m-GaN/c-GaN ratio as determined through X-ray diffractometry (2θ scan). The results are shown in FIG. 4.A.

When the ratio by mole of ammonia to trimethylaluminum was 0 or 10, c-GaN was not detected. When the ratio by mole of ammonia to trimethylaluminum was 60, a peak attributed to c-GaN was detected. When the ratio by mole of ammonia to trimethylaluminum was 110, a peak attributed to m-GaN was not detected; i.e., substantially the entire gallium nitride was formed of c-GaN.

As is clear from these data, when trimethylaluminum is supplied in the presence of a large amount of ammonia, a favorable aluminum nitride buffer layer is formed primarily on the a-plane surface of the sapphire substrate, and subsequently GaN is epitaxially grown primarily on the a-plane surface of the sapphire substrate; i.e., c-GaN is formed in a large amount, but m-GaN is formed in a small amount. This indicates that the presence of substantially no ammonia is preferred.

2. Time for Formation of Aluminum Thin Film (Thickness of Aluminum Thin Film):

The substrate temperature was maintained at 400° C. during supply of trimethylaluminum, and the period of supply thereof was varied from 0 to 480 seconds. The thus-formed gallium nitride was evaluated in terms of m-GaN/c-GaN ratio as determined through X-ray diffractometry (2θ scan). The results are shown in FIG. 4.B.

When the period of supply of trimethylaluminum was 400 seconds or shorter, a peak attributed to c-GaN was not detected. In contrast, when the period of supply of trimethylaluminum was 480 seconds, m-GaN was formed in a small amount (0.3%).

As is clear from these data, when the thickness of an aluminum thin film is excessively increased, a favorable aluminum nitride buffer layer is formed on the a-plane surface of the sapphire substrate through nitridation, and subsequently GaN is epitaxially grown primarily on the a-plane surface of the sapphire substrate; i.e., c-GaN is formed in a large amount, but m-GaN is formed in a small amount. This indicates that the thickness of the aluminum thin film must be regulated to 40 Å or less (corresponding to 400-second supply of trimethylaluminum).

3. Temperature During Formation of Aluminum Thin Film:

The period of supply of trimethylaluminum was maintained at 160 seconds (corresponding to an aluminum thin film thickness of 15 Å), and the substrate temperature was varied from 350 to 450° C. The thus-formed gallium nitride was evaluated in terms of m-GaN/c-GaN ratio as determined through X-ray diffractometry (2θ scan). The results are shown in FIG. 4.C.

When the substrate temperature was 420° C. or lower, a peak attributed to c-GaN was not detected. In contrast, when the substrate temperature was 430° C. or higher, m-GaN was formed in a small amount (about 0.01% or less), for the following reasons.

Conceivably, when the temperature for formation of an aluminum thin film is excessively high, a favorable aluminum nitride buffer layer is formed on the a-plane surface of the sapphire substrate through nitridation, and subsequently GaN is epitaxially grown primarily on the a-plane surface of the sapphire substrate; i.e., c-GaN is formed in a large amount, but m-GaN is formed in a small amount. These data indicate that the temperature during formation of the aluminum thin film must be regulated to 420° C. or lower. A formation temperature of 350° C. or higher is preferred. Favorable m-GaN may be formed even at 300° C.

The m-GaN obtained in the above experiment, in which c-GaN was not detected, was subjected to X-ray diffractometry (Φ scan) (by means of a 4-axis X-ray diffractometer) for determining crystal axis directions in m-plane. The results are shown in FIG. 5.A. The upper part of FIG. 5.A corresponds to data of Φ scan from (11-23) plane of the sapphire substrate, wherein a peak is observed in the c-axis direction of the sapphire substrate. The lower part of FIG. 5.A corresponds to data of Φ scan from (10-11) plane of the GaN, wherein a peak is observed in the c-axis direction of the GaN. Coincidence of these peaks indicates that the c-axis of the m-GaN obtained in the above experiment is parallel to the c-axis of the sapphire substrate having an a-plane main surface. This is schematically shown in FIG. 5.B. As shown in FIG. 5.B, axes of the m-GaN are denoted by the symbol "GaN," and axes of the sapphire substrate are denoted by the symbol "Sapphire."

Thus, according to the present invention, a Group III nitride-based compound semiconductor thick film having an m-plane main surface can be formed on a sapphire substrate having an a-plane main surface. In this case, the c-axis of the sapphire substrate is parallel to the c-axis of the Group III nitride-based compound semiconductor.

Thus, according to the present invention, a Group III nitride-based compound semiconductor of very good quality having an m-plane main surface can be produced without formation of a mask.

Other experiments were carried out in the same manner as described above, except that the distance A or B in the hexagonal-pattern mask shown in FIG. 3.A was changed to 0.5 μm or 0.75 μm, or the height of the mesa shown in FIG. 3.B was varied in a range of 0.35 to 1.2 μm. However, no significant difference was observed between the data obtained from these experiments and those obtained in the above experiment.

Embodiment 2

In Embodiment 2, the surface of a sapphire substrate was thermally treated without supply of trimethylaluminum; i.e., step 2 shown in FIG. 2 was omitted. That is, the surface of the sapphire substrate was thermally treated in a hydrogen atmosphere. Step 3 (nitridation) was initiated at 300 to 420° C. As a result, a relatively favorable Group III nitride-based compound semiconductor having an m-plane main surface was produced.

Even when, in step 1, cooling of the sapphire substrate was initiated at the moment when the substrate temperature reached 1,160° C. (i.e., the period during which the temperature of the sapphire substrate was maintained at 1,160° C. was zero), similar to the aforementioned case, a relatively favorable Group III nitride-based compound semiconductor having an m-plane main surface was produced.

Embodiment 3

As described below, stripe-form mesas were formed on a sapphire substrate having an m-plane main surface. Specifically, the stripe-form mesas were formed so that the longitudinal direction thereof was inclined by 45° from the c-axis toward the a-axis in the main surface.

The stripe-form mesas were formed by use of an etching mask so that the width of each mesa (i.e., unetched portion) was 2 μm, and the distance between adjacent mesas (i.e., the width of an etched portion) was 3 μm. The etching depth was regulated to 0.7 μm. The angle between the m-plane main surface and side surfaces of each stripe-form mesa was about 70°.

The m-plane sapphire substrate having the thus-formed mesas was treated in a manner similar to that described above in Embodiment 1, and then gallium nitride (Group III nitride-based compound semiconductor) was epitaxially grown, which is schematically shown in FIG. 6.

As shown in FIG. 6, a hexagonal columnar Group III nitride-based compound semiconductor was formed so as to cover a portion of each mesa of the sapphire substrate.

Thus, etching of the m-plane sapphire substrate forms a surface on which a Group III nitride-based compound semiconductor can be grown, which surface has not yet been known to allow such epitaxial growth thereon. The utility of such a surface was determined in Embodiment 3.

On the basis of the results obtained in Embodiment 3, a sapphire substrate having an a-plane main surface, a sapphire substrate having an m-plane main surface, and a sapphire substrate having a c-plane main surface were provided; stripe-form mesas each having a width of 2 μm were formed on each of the substrates in different directions within the below-described angle range; and a gallium nitride thick film was epitaxially grown thereon for 60 minutes, followed by determination of a crystal plane of the thick film parallel to the main surface of the sapphire substrate.

In Embodiments 4 to 6 described below, stripe-form mesas (width: 2 μm) were formed radially on each of the aforementioned three sapphire substrates so that the angle between adjacent mesas was 0.01°. The distance between adjacent stripe-form mesas was 2 μm at one end or 4 μm at the other end. The length of each stripe-form mesa was about 13 mm. Thus, stripe-form mesas were formed on each of the three sapphire substrates in different longitudinal directions within a range of 90°, and X-ray diffractometry (2θ scan) and X-ray diffractometry (Φ scan) (by means of a 4-axis X-ray diffractometer) were carried out every 10 degrees, to thereby determine the crystal orientation of the gallium nitride thick film formed on the substrate. After growth of gallium nitride for 120 seconds, a cross section of each stripe-form mesa perpendicular to its longitudinal direction was analyzed by use of a scanning electron micrograph (SEM), to thereby determine whether crystal growth occurs on the main surface or side surfaces of the mesa.

The gallium nitride thick film was formed in the same manner as employed in Embodiment 1, except that the growth time thereof was changed. The results are described below in Embodiments 4 to 6.

Embodiment 4

A sapphire substrate having an a-plane main surface was employed, and a gallium nitride thick film was formed under the aforementioned conditions. The analysis results are shown in Table 1. Stripe-form mesas were formed so that the longitudinal direction thereof was changed from an m-axis direction to a c-axis direction in a-plane (i.e., main surface). FIG. 7 shows data obtained through X-ray diffractometry (2θ scan) (0°, 30°, 60°, and 90°).

TABLE 1

| Angle to [10-10] (deg.) | Growth only on main surface | Growth on main surface and side surfaces | Growth only on side surfaces | Surface of GaN film parallel to main surface of substrate |
|---|---|---|---|---|
| 0 | X | X | ○ | m-plane |
| 10 | X | X | ○ | m-plane |
| 20 | X | X | ○ | m-plane |
| 30 | X | X | ○ | m-plane |
| 40 | X | X | ○ | m-plane |
| 50 | X | X | ○ | — |
| 60 | X | ○ | X | c-plane |
| 70 | X | ○ | X | c-plane |
| 80 | X | X | ○ | — |
| 90 | X | X | ○ | (11-22) |

As shown in Table 1 (i.e., data of SEM analysis of cross sections), GaN growth only on the main surface did not occur in any of the stripe-form mesas formed in the aforementioned directions.

In the case of a stripe-form mesa provided so that the angle between the longitudinal direction thereof and the m-axis (hereinafter the angle may be referred to simply as an "angle to the m-axis") was 0° to 40°, GaN growth only on the side surfaces of the mesa was observed, and X-ray diffraction analysis showed that the surface of the grown GaN thick film parallel to the a-plane main surface of the sapphire substrate was (10-10) m-plane.

In the case of a stripe-form mesa provided so that the angle between the longitudinal direction thereof and the m-axis was 50° or 80°, GaN growth only on the side surfaces of the mesa was observed, but the surface of the grown GaN thick film parallel to the a-plane main surface of the sapphire substrate was not specified through X-ray diffraction analysis.

In the case of a stripe-form mesa provided so that the angle between the longitudinal direction thereof and the m-axis was 90°, GaN growth only on the side surfaces of the mesa was observed, and X-ray diffraction analysis showed that the surface of the grown GaN thick film parallel to the a-plane main surface of the sapphire substrate was (11-22) plane.

In the case of a stripe-form mesa provided so that the angle between the longitudinal direction thereof and the m-axis was 60° or 70°, GaN growth on both the main surface and the side surfaces of the mesa was observed, and X-ray diffraction analysis showed that the surface of the grown GaN thick film parallel to the a-plane main surface of the sapphire substrate was (0001) c-plane. The peak of the c-plane GaN thick film is considered to correspond to the peak of c-plane GaN grown on the a-plane main surface of the sapphire substrate. However, conceivably, the main surface of the GaN grown on the side surfaces of the mesa was a high-index crystal plane, and a peak attributed to the plane was not observed.

X-ray diffractometry (Φ scan) was carried out for analysis of the in-plane orientation of the (11-20) a-plane sapphire substrate and the (10-10) m-plane GaN grown on the mesas provided so as to attain an angle to the m-axis of 0° to 40°. Specifically, X-ray diffractometry (Φ scan) was carried out on (10-11) plane of the m-plane GaN and (11-23) plane of the a-plane sapphire substrate. All the data obtained through in-plane orientation analysis showed that the c-axis of the m-plane GaN was parallel to the c-axis of the a-plane sapphire substrate (see FIG. 8).

[Discussion of Embodiment 4]

In general, when GaN is grown directly on a (11-20) a-plane sapphire substrate, or grown thereon via a buffer layer, (0001) c-plane of the GaN becomes parallel to the main surface (i.e., (11-20) a-plane) of the sapphire substrate.

In the case of a stripe-form mesa of an a-plane sapphire substrate provided so that the angle between the longitudinal direction of the mesa and the m-axis is 0° to 40°, when the side surfaces of the mesa are (0001) c-plane or a plane which is off (0001) c-plane, GaN is grown so that (10-10) m-plane of the GaN becomes parallel to the main surface (i.e., (11-20) a-plane) of the sapphire substrate. In the in-plane orientation of the sapphire substrate and the GaN, the c-axis of the GaN is parallel to the c-axis of the sapphire substrate. This phenomenon will be described in more detail below.

As has been known, c-plane GaN is grown on a c-plane sapphire substrate. In the in-plane orientation of the sapphire substrate and the GaN, the a-axis direction of the c-plane sapphire substrate is parallel to the m-axis direction of the c-plane GaN, as shown in FIG. 9.

When (0001) c-plane GaN is grown on the aforementioned side surfaces of the mesas (i.e., (0001) c-plane or a plane which is off (0001) c-plane)—which are formed through processing of the a-plane sapphire substrate—and the aforementioned known in-plane orientation (as shown in FIG. 9) is attained, growth of the GaN occurs so that (10-10) m-plane of the GaN is parallel to the main surface (i.e., (11-20) a-plane) of the sapphire substrate. All the side surfaces are assumed to be a plane which is off (0001) c-plane, on the basis of the fact that the similar data were obtained through in-plane orientation analysis of the (10-10) m-plane GaN grown on the side surfaces of the mesas provided so as to attain an angle to the m-axis of 0° to 40°.

In the case of a stripe-form mesa provided so that the angle between the longitudinal direction thereof and the m-axis is 50° to 90°, the side surfaces of the mesa of the sapphire substrate are a high-index crystal plane such as (10-14), (10-15), or (10-10) plane. In the case of a stripe-form mesa provided so as to attain an angle to the m-axis of 60° or 70°, SEM analysis showed that GaN growth occurred on the main surface and the side surfaces of the mesa. This indicates that GaN growth is difficult to occur preferentially on side surfaces of such a high-index crystal plane. X-ray diffractometry showed a peak attributed to (0001) c-plane. Therefore, conceivably, (0001) c-plane GaN was grown on the main surface of the substrate. In the case of a stripe-form mesa provided so as to attain an angle to the m-axis of 60° or 70°, GaN growth on the side surfaces of the mesa was observed through SEM analysis, but a peak attributed to GaN grown on the side surfaces was not observed through X-ray diffractometry. The crystal orientation of GaN grown on a surface of such a high-index crystal plane has not yet been known. Therefore, it is difficult to assume the crystal orientation of GaN grown parallel to the main surface (i.e., (11-20) a-plane) of the sapphire substrate. However, in the case of a stripe-form mesa provided so as to attain an angle to the m-axis of 50°, 80°, or 90°, GaN growth only on the side surfaces of such a high-index crystal plane was observed. This indicates that GaN growth occurred more preferentially on these side surfaces than on the main surface of the substrate.

Embodiment 5

A sapphire substrate having an m-plane main surface was employed, and a gallium nitride thick film was formed under the aforementioned conditions. The analysis results are shown in Table 2. Stripe-form mesas were formed so that the longitudinal direction thereof was changed from an a-axis direction to a c-axis direction in m-plane (i.e., main surface). FIG. 10 shows data obtained through X-ray diffractometry (2θ scan) (0°, 30°, 70°, and 90°).

TABLE 2

| Angle to [11-20] (deg.) | Growth only on main surface | Growth on main surface and side surfaces | Growth only on side surfaces | Surface of GaN film parallel to main surface of substrate |
|---|---|---|---|---|
| 0 | X | ◯ | X | (11-22) |
| 10 | X | ◯ | X | (11-22) |
| 20 | X | X | ◯ | (11-22) |
| 30 | X | X | ◯ | — |
| 40 | X | X | ◯ | — |
| 50 | X | X | ◯ | — |
| 60 | X | X | ◯ | — |
| 70 | X | X | ◯ | r-plane |
| 80 | X | X | ◯ | m-plane |
| 90 | X | ◯ | X | m-plane and (11-22) |

As shown in Table 2 (data of SEM analysis of cross sections), GaN growth only on the main surface did not occur in any of the stripe-form mesas provided in the aforementioned directions. In the case of a stripe-form mesa provided so that the angle between the longitudinal direction thereof and the a-axis (hereinafter the angle may be referred to simply as an "angle to the a-axis") was 0° or 10°, GaN growth on the main surface and the side surfaces of the mesa was observed, and X-ray diffraction analysis showed that (11-22) plane of the grown GaN thick film was parallel to the m-plane main surface of the sapphire substrate. As has been known, in general, (11-22) GaN, (10-10) m-plane GaN, (10-13) GaN, or a mixed crystal thereof is grown on a (10-10) m-plane sapphire substrate. Therefore, conceivably, data of X-ray diffraction analysis of the (11-22) plane correspond to a peak attributed to (11-22) plane of GaN grown on the main surface of the substrate. In the case of a stripe-form mesa provided so as to attain an angle to the a-axis of 20°, GaN growth only on the side surfaces of the mesa was observed, and X-ray diffraction analysis showed a weak peak attributed to (11-22) plane of GaN. This suggests that a small amount of GaN was grown so that (11-22) plane thereof was parallel to the main surface. In the case of a stripe-form mesa provided so as to attain an angle to the a-axis of 30° to 60°, GaN growth only on the side surfaces of the mesa was observed, but the crystal orientation of the surface of the grown GaN thick film parallel to the main surface was not specified (Embodiment 3). In the case of a stripe-form mesa provided so as to attain an angle to the a-axis of 70°, GaN growth only on the side surfaces of the mesa was observed, and, despite low X-ray intensity, the surface of the grown GaN thick film parallel to the main surface was specified as being (10-12) r-plane. In the case of a stripe-form mesa provided so as to attain an angle to the a-axis of 80°, GaN growth only on the side surfaces of the mesa was observed. In the case of a stripe-form mesa provided so as to attain an angle to the a-axis of 90°, a weak peak considered to be attributed to GaN grown in the main surface was observed. X-ray diffraction analysis showed a peak attributed to (10-10) m-plane of GaN (angle to the a-axis: 80° or 90°). This GaN m-plane peak is considered to be attributed to GaN grown on the side surfaces of the mesa. In the case of a stripe-form mesa provided so as to attain an angle to the a-axis of 90°, a peak attributed to (11-22) plane was observed. This peak is considered to be attributed to GaN grown on the main surface.

X-ray diffractometry (Φ scan) was carried out for analysis of the in-plane orientation of the (10-10) m-plane sapphire substrate and the (10-10) m-plane GaN grown on the mesas provided so as to attain an angle to the a-axis of 80° or 90°. Specifically, X-ray diffractometry (Φ scan) was carried out on (10-11) plane of the m-plane GaN and (11-20) plane of the m-plane sapphire substrate. All the data obtained through in-plane orientation (X-ray diffraction) analysis showed that the c-axis of the m-plane GaN was parallel to the c-axis of the m-plane sapphire substrate (see FIG. 11).

[Discussion of Embodiment 5]

As has been reported, in general, when GaN is grown directly on a (10-10) m-plane sapphire substrate, or grown thereon via a buffer layer, growth of GaN occurs so that (11-22) plane, (10-10) m-plane, or (10-13) plane thereof is parallel to the main surface (i.e., (10-10) m-plane) of the sapphire substrate.

In the case of a stripe-form mesa provided so that the angle between the longitudinal direction thereof and the a-axis was 0° to 20°, SEM analysis showed that GaN was grown on the main surface and the side surfaces of the mesa (i.e., GaN growth did not occur preferentially on the side surfaces). X-ray diffraction analysis showed a peak attributed to (11-22) plane, which suggests that GaN was grown primarily on the main surface of the substrate. SEM analysis showed GaN growth on the side surfaces, but X-ray diffraction analysis did not show a peak considered to be attributed to GaN grown on the side surfaces.

In the case of a stripe-form mesa provided so that the angle between the longitudinal direction thereof and the a-axis was 30° to 60°, SEM analysis showed that GaN was grown only on the side surfaces of the mesa (i.e., GaN growth occurred preferentially on these side surfaces). However, X-ray diffraction analysis showed no peak; i.e., X-ray diffraction analysis did not elucidate the crystal orientation of GaN grown parallel to the main surface (i.e., (10-10) m-plane) of the sapphire substrate. In this case, the side surfaces of the mesa of the sapphire substrate are a high-index crystal plane such as (11-23) or (11-24) plane. The crystal orientation of GaN grown on a surface of such a high-index crystal plane has not yet been known. Therefore, it is difficult to assume the crystal orientation of GaN grown parallel to the main surface (i.e., (10-10) m-plane) of the sapphire substrate. However, in the case of a stripe-form mesa provided so as to attain an angle to the a-axis of 30° to 60°, GaN growth only on the side surfaces of such a high-index crystal plane was observed. This indicates that GaN growth occurred more preferentially on these side surfaces than on the main surface of the substrate.

In the case of a stripe-form mesa provided so as to attain an angle to the a-axis of 40° to 50°, X-ray diffraction analysis showed no peak, but SEM analysis of the mesa cross section indicated that (11-20) a-plane of GaN was slightly inclined (see Embodiment 3 (FIG. 6)).

In the case of a stripe-form mesa provided so that the angle between the longitudinal direction thereof and the a-axis was 70°, GaN growth only on the side surfaces of the mesa was observed. This indicates that GaN growth occurred preferentially on these side surfaces. X-ray diffraction analysis showed that GaN growth occurred so that (10-12) r-plane of the GaN was parallel to the main surface of the substrate. The side surfaces of the mesa are a high-index crystal plane of the sapphire substrate, and the crystal orientation of GaN grown on such a surface has not yet been known. Therefore, it is difficult to explain the reason why GaN growth occurred so that (10-12) r-plane of the GaN was parallel to the main surface of the sapphire substrate. X-ray diffractometry (Φ scan) was carried out for analysis of the in-plane orientation of the GaN. The results are shown in FIG. 12. FIG. 13 schematically shows the crystal orientation of the GaN. In FIG. 13, the cut hexagonal column represents the grown GaN crystal, and the axis direction of the hexagonal column corresponds to the c-axis of the GaN. Conceivably, GaN growth occurred in the plane direction shown in FIG. 13.

In the case of a stripe-form mesa of an m-plane sapphire provided so that the angle between the longitudinal direction of the mesa and the a-axis is 80° or 90°, when the side surfaces of the mesa are (11-20) a-plane or a plane which is off (11-20) a-plane, GaN is grown so that (10-10) m-plane thereof is parallel to the main surface (i.e., (10-10) m-plane) of the sapphire substrate. This phenomenon will be described below.

As has been known, c-plane GaN is grown on an a-plane sapphire substrate. In the in-plane orientation of the sapphire substrate and the GaN, the m-axis direction of the sapphire substrate is parallel to the a-axis direction of the GaN.

When GaN is grown on the aforementioned side surfaces of the mesas (i.e., (11-20) a-plane or a plane which is off (11-20) a-plane)—which are formed through processing of the m-plane sapphire substrate—so that (0001) c-plane is parallel to the side surfaces, and the aforementioned known in-plane orientation is attained, conceivably, growth of the GaN occurs so that (11-20) a-plane of the GaN is parallel to the main surface (i.e., (10-10) m-plane) of the sapphire substrate.

However, in Embodiment 5, GaN growth occurred so that (10-10) m-plane of the sapphire substrate was parallel to (10-10) m-plane of the GaN (see FIG. 14). This differs from the aforementioned known phenomenon. The cause of such GaN growth is considered as follows.

As described above, it is known that when GaN is grown on an a-plane sapphire substrate, GaN growth occurs so that c-plane of the GaN is parallel to the main surface of the substrate. In the in-plane orientation of the sapphire substrate and the GaN, the m-axis direction of the sapphire substrate is parallel to the a-axis direction of the GaN, and, as has also been reported, the m-axis direction of the sapphire substrate is parallel to the m-axis direction of the GaN (J. Appl. Phys. 74, 4430 (1993), Appl. Phys. Lett., Vol. 82, No. 5, 3 Feb. 2003). In the latter case, conceivably, growth of the GaN occurs so that (10-10) m-plane of the GaN is parallel to the main surface (i.e., (10-10) m-plane) of the sapphire substrate.

Embodiment 6

A sapphire substrate having a c-plane main surface was employed, and a gallium nitride thick film was formed under the aforementioned conditions. The analysis results are shown in Table 3. Stripe-form mesas were provided so that the longitudinal direction thereof was changed by 90° from an m-axis direction to an a-axis direction in c-plane (i.e., main surface). FIG. 15 shows data obtained through X-ray diffractometry (2θ scan) (0°, 30°, 60°, and 90°).

TABLE 3

| Angle to [10-10] (deg.) | Growth only on main surface | Growth on main surface and side surfaces | Growth only on side surfaces | Surface of GaN film parallel to main surface of substrate |
|---|---|---|---|---|
| 0 | X | X | ○ | m-plane |
| 10 | X | X | ○ | m-plane |
| 20 | X | X | ○ | a-plane |
| 30 | X | X | ○ | a-plane |
| 40 | X | X | ○ | a-plane |
| 50 | X | X | ○ | m-plane |
| 60 | X | X | ○ | m-plane |
| 70 | X | X | ○ | m-plane |
| 80 | X | X | ○ | a-plane |
| 90 | X | X | ○ | a-plane |

As shown in Table 3 (data of SEM analysis of cross sections), GaN growth only on side surfaces occurred in all the stripe-form mesas provided in the aforementioned directions. In the case of a mesa provided so that the angle between the longitudinal direction thereof and the m-axis (hereinafter the angle may be referred to simply as an "angle to the m-axis") was 0°, 10°, or 50° to 70°, X-ray diffraction analysis showed that (10-10) m-plane of the GaN thick film was parallel to the c-plane main surface of the sapphire substrate. In the case of a mesa provided so as to attain an angle to the m-axis of 20° to 40°, 80°, or 90°, X-ray diffraction analysis showed that (11-20) a-plane of the GaN thick film was parallel to the c-plane main surface of the sapphire substrate. That is, the surface of the GaN thick film parallel to the main surface of the sapphire substrate was found to have different crystal orientations (m-plane and a-plane) every 30 degrees. Since the c-plane sapphire substrate has threefold symmetry, the side surfaces of stripe-form mesas have different crystal orientations (m-plane and a-plane) every 30 degrees. Conceivably, this crystal symmetry is reflected in the aforementioned results. In Embodiment 6, stripe-form mesas were provided so that the angle between the longitudinal direction thereof and the m-axis was varied in a range of 0° to 90°. However, it is readily predicted that, in the case of a mesa provided so as to attain an angle to the m-axis of 110° to 130°, 170° to 190°, 230° to 250°, 290° to 310°, 350°, or 360°, the surface of the grown GaN thick film parallel to the main surface of the sapphire substrate is m-plane, whereas in the case of a mesa provided so as to attain an angle to the m-axis of 90°, 100°, 140° to 160°, 200° to 220°, 260° to 280°, or 320° to 340°, the surface of the grown GaN thick film parallel to the main surface of the sapphire substrate is a-plane.

X-ray diffractometry (Φ scan) was carried out for analysis of the in-plane orientation of the GaN thick film whose surface parallel to the main surface of the sapphire substrate was m-plane (angle to the m-axis: 0°, 10°, or 50° to 70° or a-plane (angle to the m-axis: 20° to 40°, 80°, or) 90°).

In the case where the surface of the GaN thick film parallel to the main surface of the sapphire substrate was m-plane, X-ray diffractometry (Φ scan) was carried out on (10-11) plane of the GaN thick film and on (11-23) plane of the sapphire substrate. The results are shown in FIG. 16. As shown in FIG. 16, the c-axis of the GaN thick film was parallel to the a-axis of the sapphire substrate.

In the case where the surface of the GaN thick film parallel to the main surface of the sapphire substrate was a-plane, X-ray diffractometry (Φ scan) was carried out on (10-10) plane of the GaN thick film and on (11-23) plane of the sapphire substrate. The results are shown in FIG. 17. As shown in FIG. 17, the m-axis of the GaN thick film was parallel to the m-axis of the sapphire substrate, and the GaN thick film was found to have three domain structures.

[Discussion of Embodiment 6]

In general, when GaN is grown directly on a sapphire substrate having a (0001) c-plane main surface, or grown thereon via a buffer layer, growth of GaN occurs so that (0001) c-plane thereof is parallel to the main surface (i.e., (0001) c-plane) of the sapphire substrate.

In the case where the longitudinal direction of a processed stripe-form mesa of a c-plane sapphire substrate is almost parallel to the m-axis, and the side surfaces of the mesa is (11-20) a-plane of the sapphire substrate or a plane which is off the (11-20) a-plane, GaN is grown so that (10-10) m-plane thereof is parallel to the main surface (i.e., (0001) c-plane) of the sapphire substrate. This phenomenon will be described below.

As has been known, c-plane GaN is grown on an a-plane sapphire substrate. In the in-plane orientation of the sapphire substrate and the GaN, the c-axis direction of the sapphire substrate is parallel to the m-axis direction of the GaN, as shown in FIG. 18.

In Embodiment 6, (0001) c-plane GaN was grown on the side surfaces of mesas (i.e., (11-20) a-plane or a plane which is off (11-20) a-plane) which were formed through processing of the c-plane sapphire substrate, and the aforementioned known in-plane orientation (as shown in FIG. 18) was attained. Therefore, GaN was grown so that (10-10) m-plane thereof was parallel to the (0001) c-plane surface of the sapphire substrate.

In the case where the longitudinal direction of a processed stripe-form mesa of a c-plane sapphire substrate is almost parallel to the a-axis, and the side surfaces of the mesa is (10-10) m-plane of the sapphire substrate or a plane which is off the (10-10) m-plane, GaN is grown so that (11-20) a-plane thereof is parallel to the main surface (i.e., (0001) c-plane) of the sapphire substrate. This phenomenon will be described below.

As has been reported, (10-10) m-plane GaN, (11-22) plane GaN, or a mixed crystal thereof is grown on an m-plane sapphire substrate (see R. Armitage and H. Hirayama, et al., Appl. Phys. Lett. 92, 092121 (2008)). As has also been reported, (10-10) m-plane GaN or (10-13) plane GaN is grown on an m-plane sapphire substrate (see T. WEI, et al., Jpn. J. Appl. Phys., Vol. 47, No. 5 (2008)).

As has been known, when m-plane GaN is grown on an m-plane sapphire substrate, in the in-plane orientation of the GaN and the sapphire substrate, the c-axis direction of the sapphire substrate is orthogonal to the c-axis direction of the GaN (see FIG. 19). However, in Embodiment 6, the [10-10] m-axis direction of the GaN thick film was parallel to the three equivalent <10-10> m-axis directions of the sapphire substrate, and the GaN thick film was found to have three domain structures. Therefore, the results obtained in Embodiment 6 cannot be understood only on the basis of the phenomenon that m-plane GaN is grown on an m-plane sapphire substrate.

When GaN is grown on a (10-10) m-plane sapphire substrate so that (10-13) plane of the GaN is parallel to the main surface of the substrate, the angle between the c-axis direction of the (10-13) GaN and the m-axis direction of the m-plane sapphire substrate is about 32° (see FIG. 20). When the GaN crystals shown in FIGS. 19 and 20 and GaN crystal corresponding to 180°-rotation of the GaN crystal shown in FIG. 20 are co-present, GaN is grown so that (11-20) a-plane thereof is parallel to (0001) c-plane of the sapphire substrate, and the (11-20) a-plane GaN has three domain structures (see the data of X-ray diffractometry (Φ scan) in FIG. 17), which is similar to the results obtained in Embodiment 6.

Conceivably, in Embodiment 6, three types of GaN crystals (i.e., (10-10) m-plane GaN crystal and two types of (10-13) GaN crystals) were simultaneously grown on the side surfaces ((10-10) m-plane or a plane which is off (10-10) m-plane) formed through processing of the c-plane sapphire substrate, and GaN having three domain structures was grown so that (11-20) a-plane thereof was parallel to the main surface (i.e., (0001) c-plane) of the sapphire substrate.

[Results]

When GaN is grown on side surfaces ((0001) c-plane) of mesas formed through alkali etching of a (11-20) a-plane sapphire substrate so that (0001) c-plane of the GaN is parallel to the side surfaces, GaN growth proceeds in an −c-axis direction.

When a (11-20) a-plane sapphire substrate is processed to form mesas whose side surfaces are (0001) c-plane, GaN growth occurs more preferentially on the (0001) c-plane side surfaces than on the (11-20) a-plane main surface.

When a (0001) c-plane sapphire substrate is processed to form mesas whose side surfaces are (11-20) a-plane, GaN growth occurs more preferentially on the (11-20) a-plane side surfaces than on the (0001) c-plane main surface. These phenomena are contradictory to the idea that GaN growth is likely to occur on either an a-plane or c-plane surface. Therefore, a natural idea is that GaN growth is likely to occur on side surfaces formed through processing of the sapphire substrate, rather than that GaN growth is likely to occur on either an a-plane or c-plane surface. In the present invention, thermal treatment and nitridation are carried out under conditions optimal for selective GaN growth.

When a (0001) c-plane sapphire substrate is processed to form mesas whose side surfaces are (10-10) m-plane, GaN growth occurs more preferentially on the (10-10) m-plane side surfaces than on the (0001) c-plane main surface. In this case, GaN is grown so that (11-20) a-plane thereof is parallel to the (0001) c-plane main surface.

When a (10-10) m-plane sapphire substrate is processed to form mesas whose side surfaces are (11-20) a-plane, GaN growth occurs more preferentially on the (11-20) a-plane side surfaces than on the (10-10) m-plane main surface. In this case, GaN is grown so that (10-10) m-plane thereof is parallel to the (10-10) m-plane main surface.

INDUSTRIAL APPLICABILITY

The present invention facilitates formation of a Group III nitride-based compound semiconductor device in which the m-axis is in a thickness direction (i.e., a direction perpendicular to the interface between layers of different compositions formed through epitaxial growth). Thus, the present invention facilitates formation of a Group III nitride-based compound semiconductor device (e.g., light-emitting device or HEMT) in which a piezoelectric field is not generated between layers of different compositions.

Brief Description of the Drawings

FIG. 1.A A perspective view of a mesa formed on a sapphire substrate having an a-plane main surface employed in the present invention.

FIG. 1.B A cross-sectional view of mesas formed on a sapphire substrate having an a-plane main surface.

FIG. 1.C A perspective view of another mesa formed on a sapphire substrate having an a-plane main surface.

FIG. 1.D A plan view of an etching mask employed for processing of a substrate.

FIG. 1.E A perspective view of a substrate processed by use of the mask shown in FIG. 1.D.

FIG. 1.F A plan view of another etching mask employed for processing of a substrate.

FIG. 1.G A perspective view of a substrate processed by use of the mask shown in FIG. 1.F.

FIG. 1.H A schematic representation of Group III nitride-based compound semiconductors grown in opposite directions.

FIG. 1.I A schematic representation of Group III nitride-based compound semiconductors grown in the same direction.

FIG. 1.J Another schematic representation of Group III nitride-based compound semiconductors grown in the same direction.

FIG. 1.K A plan view of an etching mask employed for processing of a substrate.

FIG. 1.L A plan view of an etching mask employed for processing of a substrate for attaining crystal growth in the same direction.

FIG. 3.A A plan view of a mask for forming mesas on a sapphire substrate having an a-plane main surface employed in the present invention.

FIG. 3.B A perspective view of a formed mesa.

FIG. 4 Three graphs showing the percentage of m-GaN grown under three different conditions in Embodiment 1, the percentage being determined through X-ray diffractometry.

FIG. 5 Data of Φ scan in Embodiment 1 showing that the c-axis direction of m-GaN corresponds to the c-axis of a sapphire substrate (5.A), and a schematic representation of axis directions of two crystals (5.B).

Description of Reference Numerals

Figure 2:
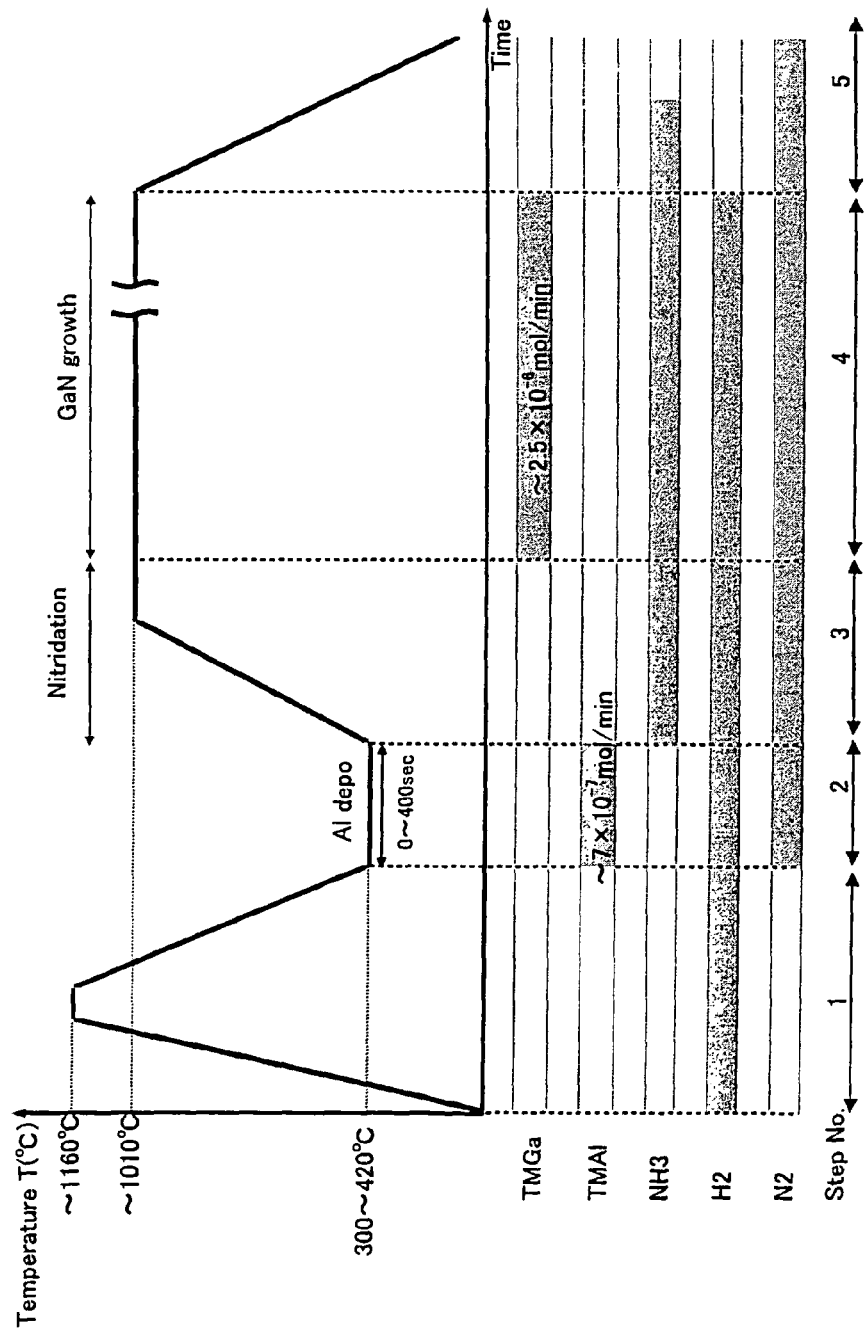
FIG. 2 A schematic diagram of a specific embodiment of the method of the present invention, which shows the temperature of a substrate and supply/non-supply of raw materials in steps of the method.
Figure 6:
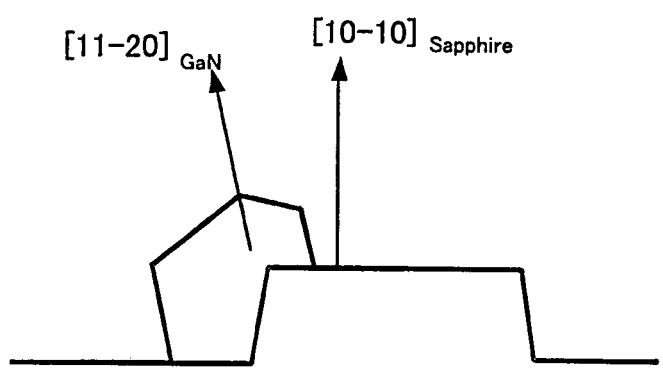
FIG. 6 A schematic representation of a Group III nitride-based compound semiconductor grown on a side surface of a stripe-form mesa of a sapphire substrate having an m-plane main surface.
Figure 7:
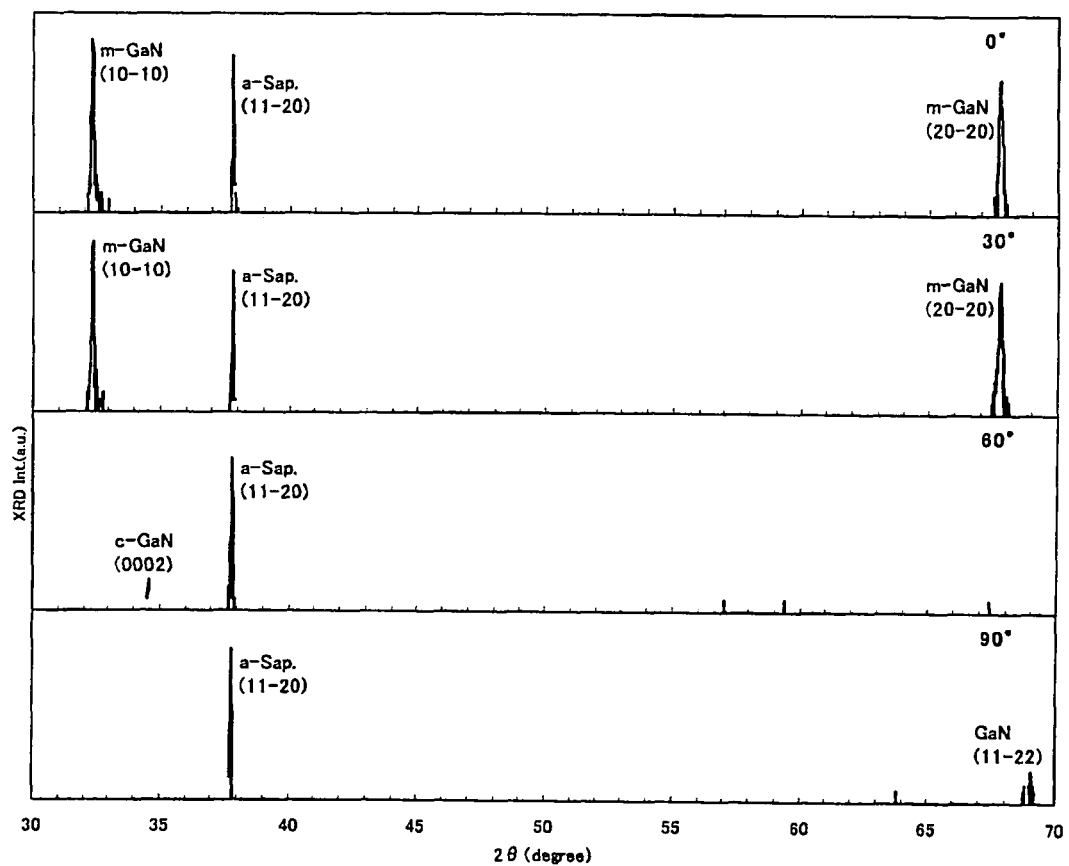
FIG. 7 A graph showing four types of data obtained through X-ray diffractometry (2θ) in Embodiment 4.
Figure 8:
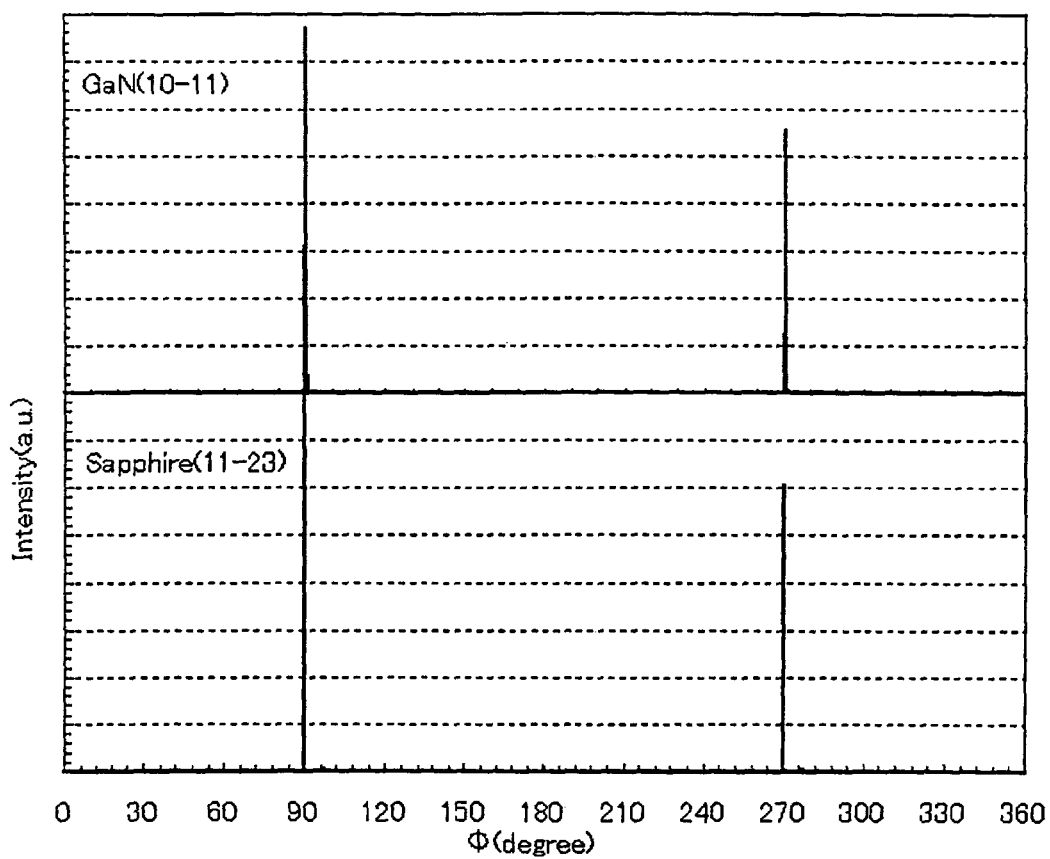
FIG. 8 A graph showing data obtained through X-ray diffractometry (Φ scan) in Embodiment 4.
Figure 9:
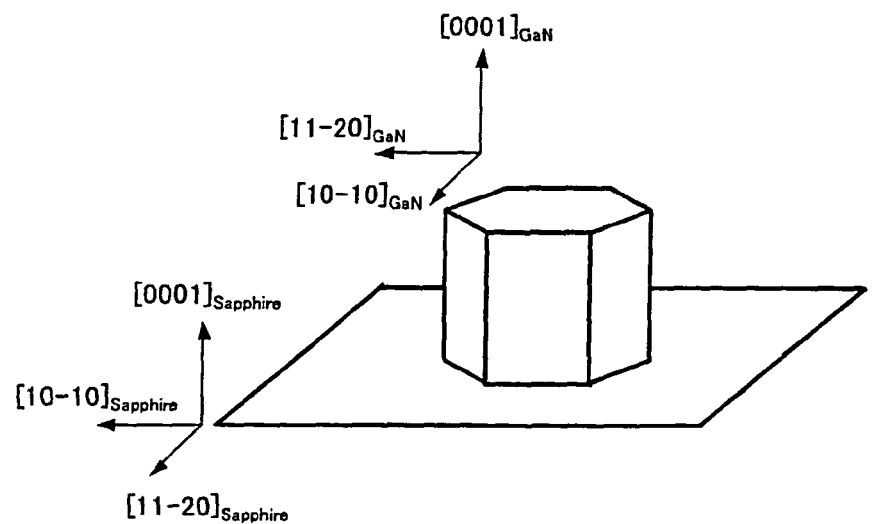
FIG. 9 A schematic representation of the crystal orietation of GaN grown on a mesa side surface (i.e., a c-plane surface of a sapphire substrate) in Embodiment 4.
Figure 10:
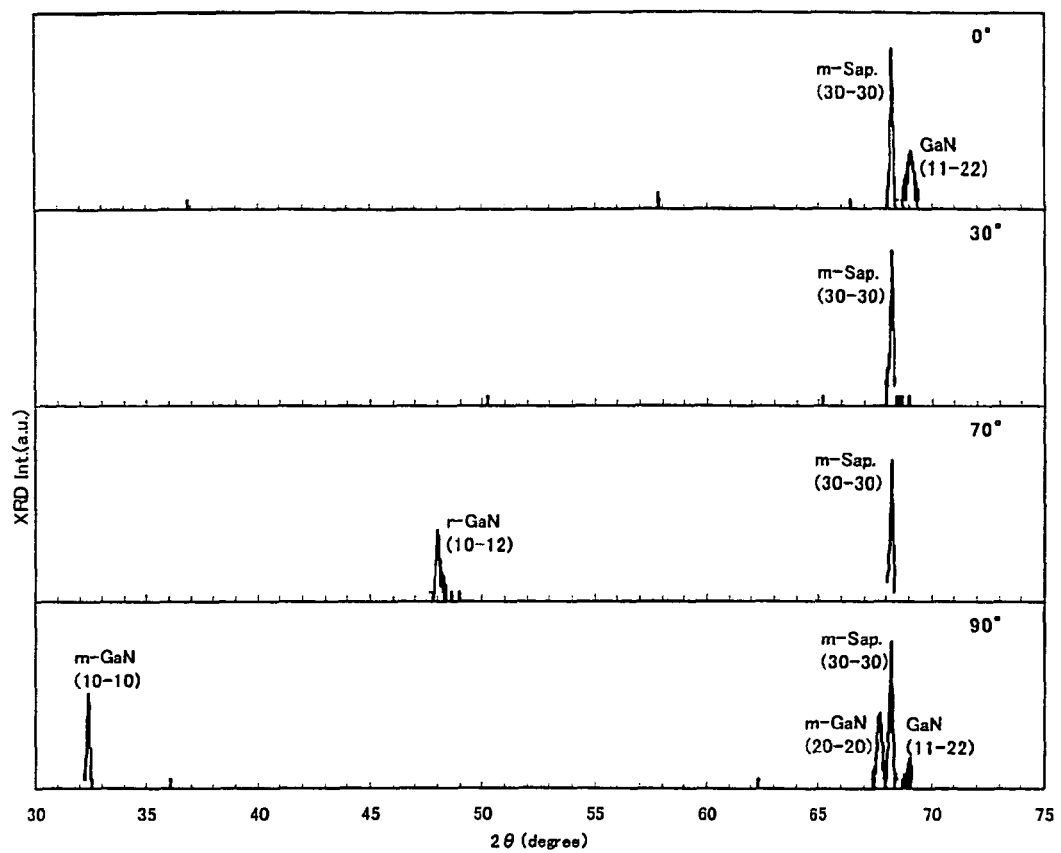
FIG. 10 A graph showing four types of data obtained through X-ray diffractometry (2θ) in Embodiment 5.
Figure 11:
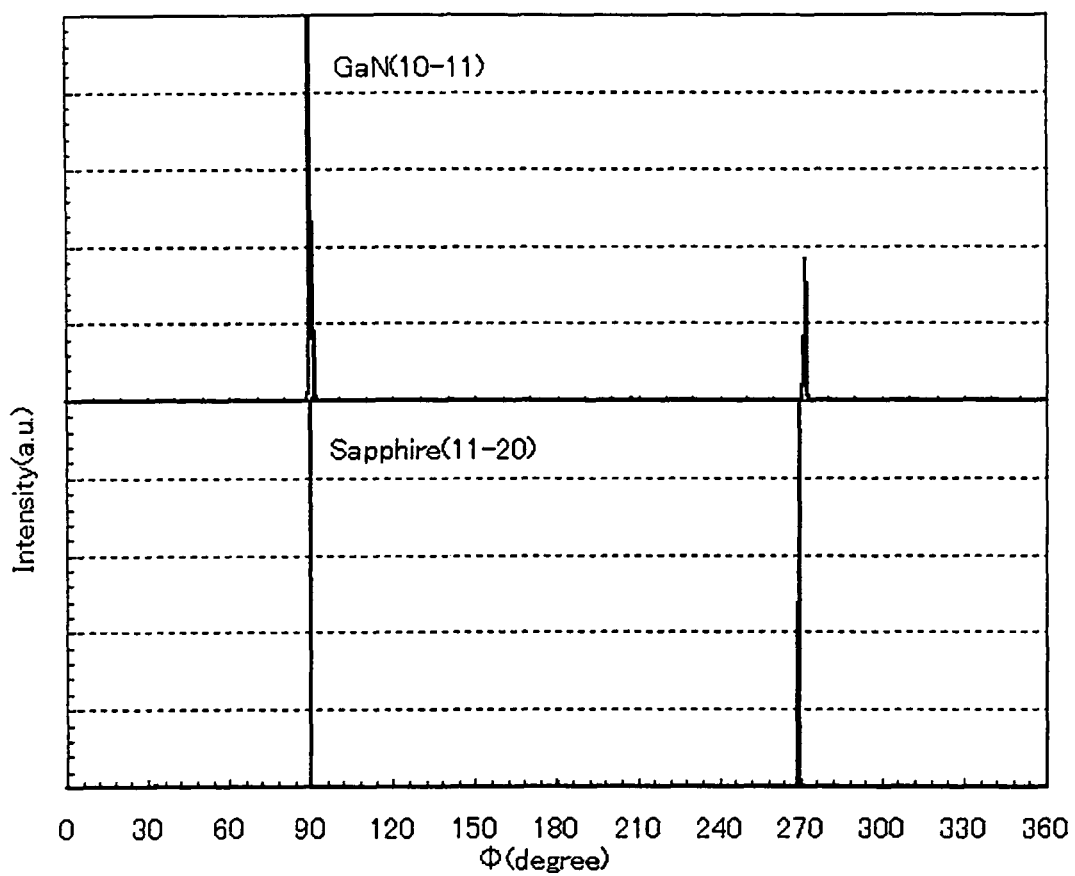
FIG. 11 A graph showing data obtained through X-ray diffractometry (Φ scan) in Embodiment 5.
Figure 12:
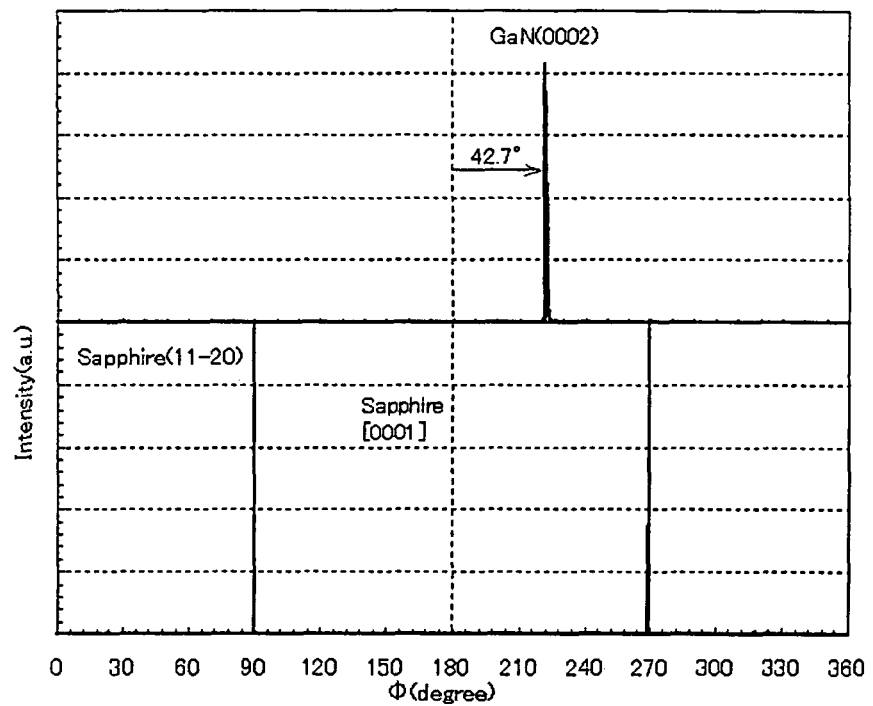
FIG. 12 A graph showing other data obtained through X-ray diffractometry (Φ scan) in Embodiment 5.
Figure 13:
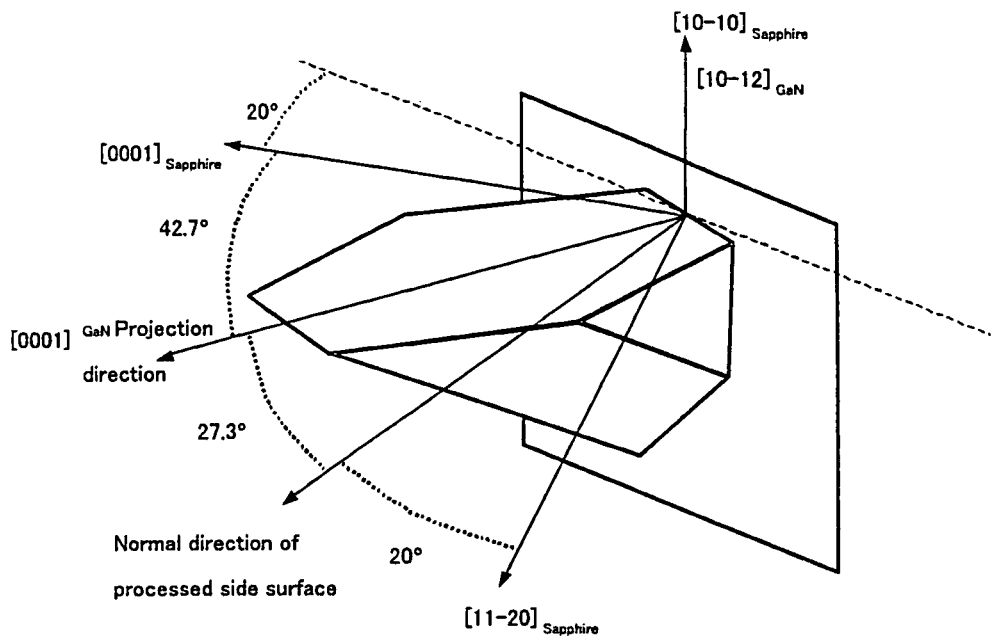
FIG. 13 A schematic representation of the crystal orientation of GaN grown on a side surface of a mesa formed on a sapphire substrate in Embodiment 5.
Figure 14:
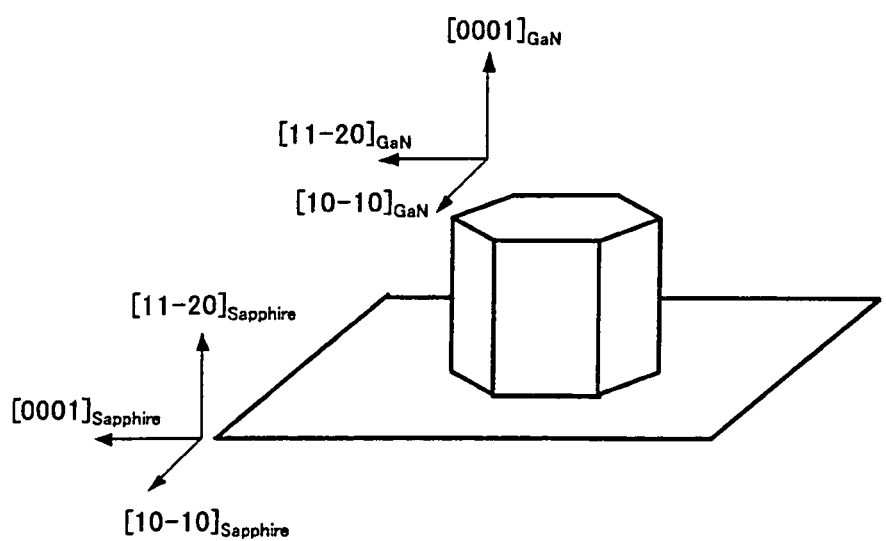
FIG. 14 A schematic representation of the crystal orientation of GaN grown on a mesa side surface (i.e., an a-plane surface of a sapphire substrate) in Embodiment 5.
Figure 15:
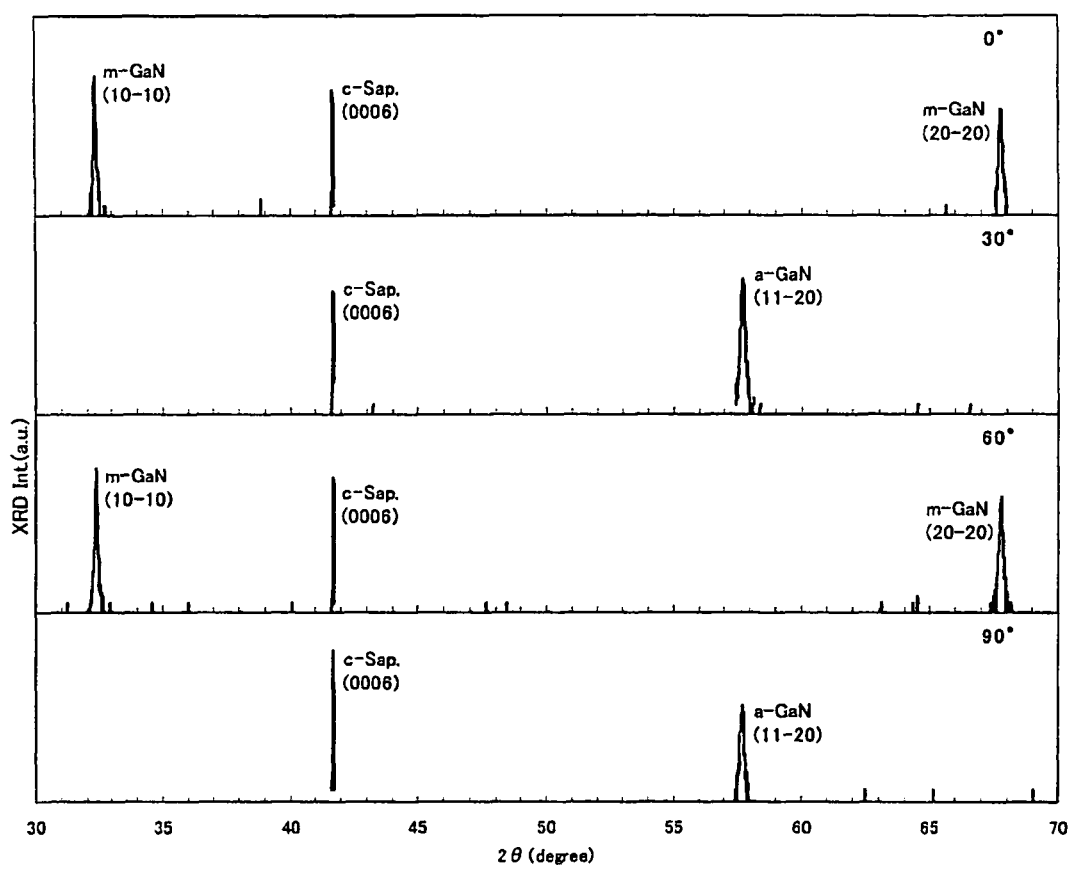
FIG. 15 A graph showing four types of data obtained through X-ray diffractometry (2θ) in Embodiment 6.
Figure 16:
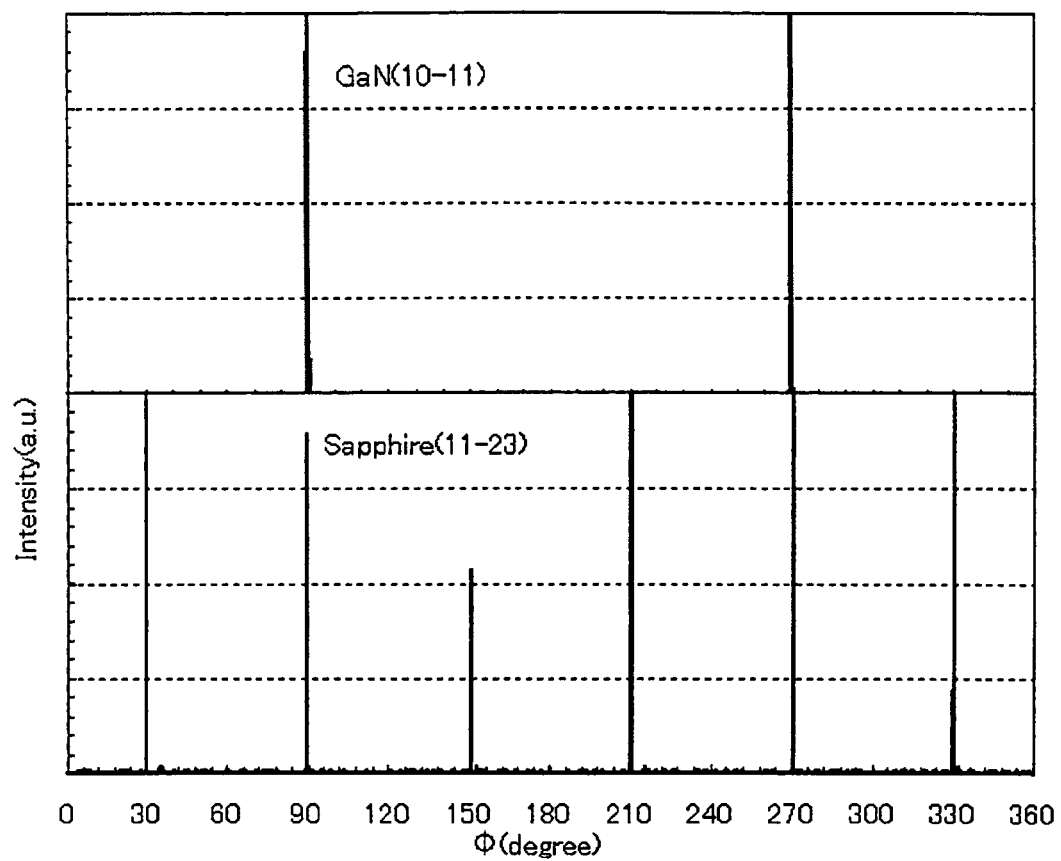
FIG. 16 A graph showing data obtained through X-ray diffractometry (Φ scan) in Embodiment 6.
Figure 17:
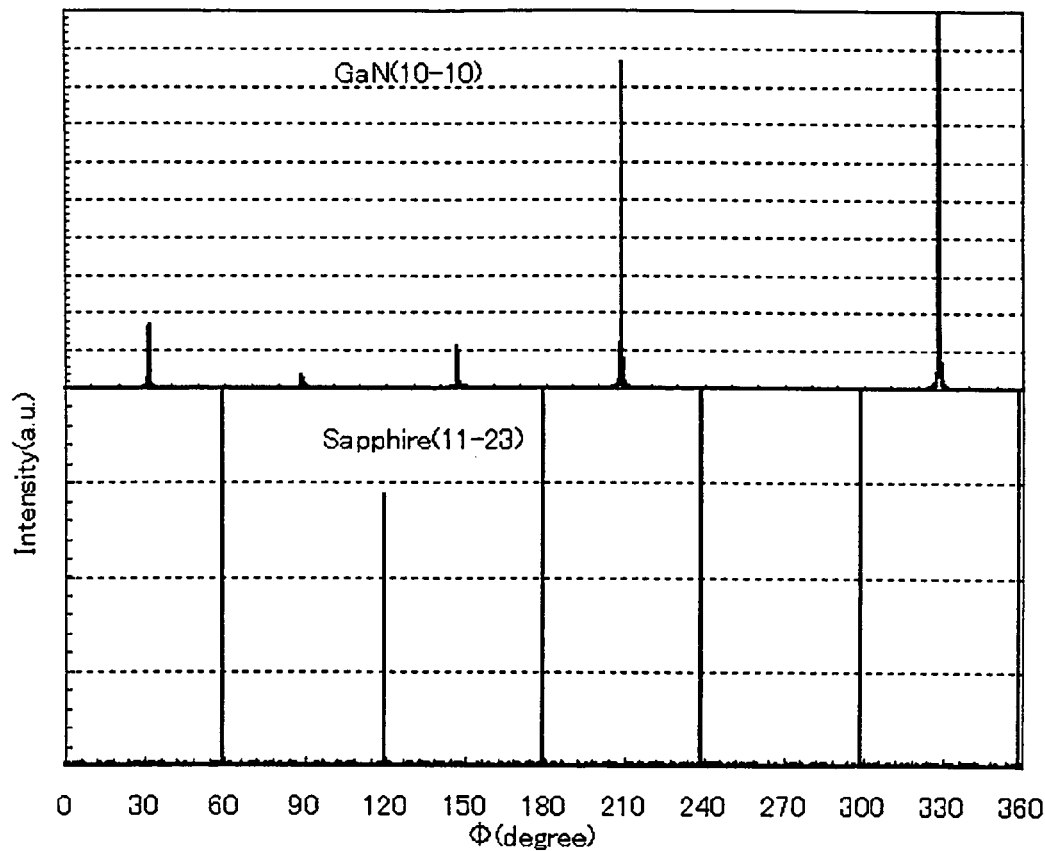
FIG. 17 A graph showing other data obtained through X-ray diffractometry (Φ scan) in Embodiment 6.
Figure 18:
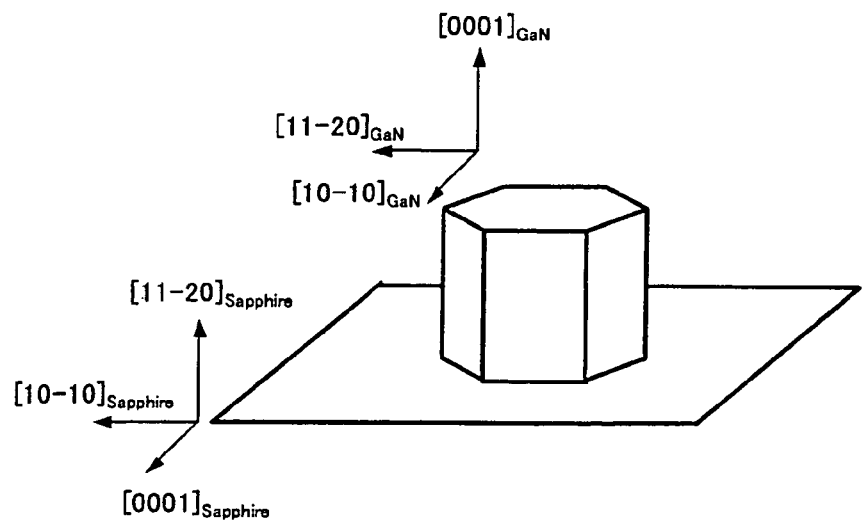
FIG. 18 A schematic representation of the crystal orientation of GaN grown on a mesa side surface (i.e., an a-plane surface of a sapphire substrate) in Embodiment 6.
Figure 19:
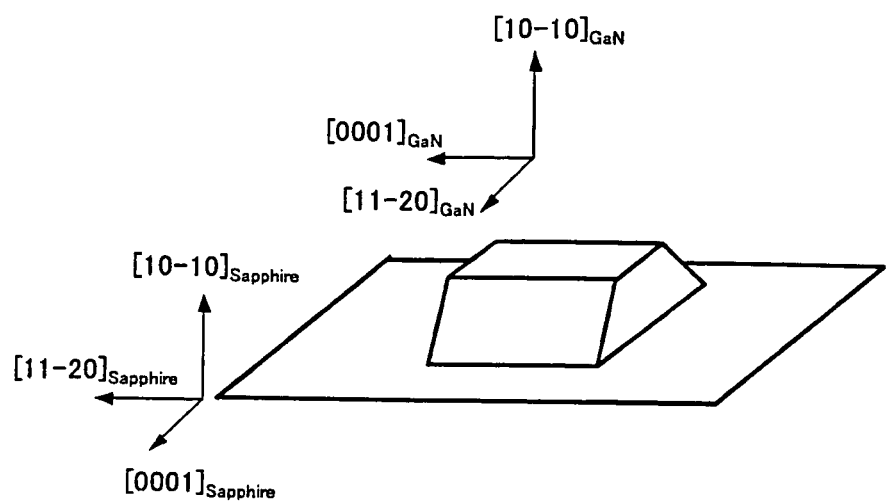
FIG. 19 A schematic representation of the crystal orientation of GaN grown on a mesa side surface (i.e., an m-plane surface of a sapphire substrate) in Embodiment 6.
Figure 20:
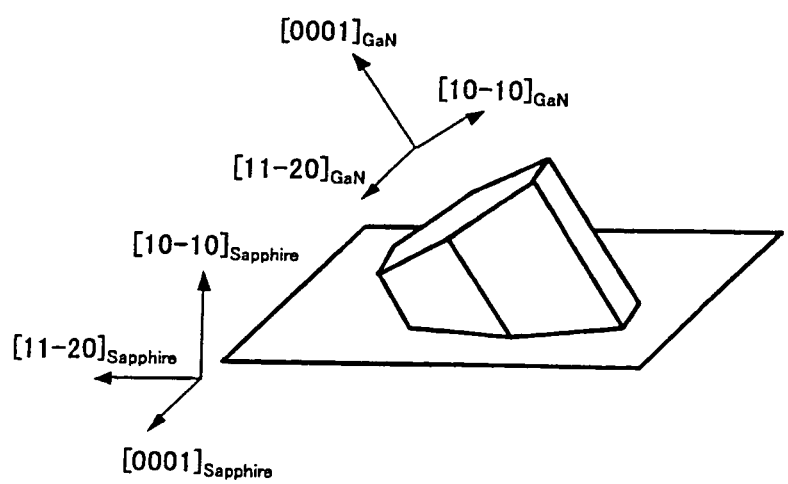
FIG. 20 A schematic representation of the crystal orientation of another GaN grown on a mesa side surface (i.e., an m-plane surface of a sapphire substrate) in Embodiment 6.

A: Distance between opposing sides of a hexagonal opening in a mask

B: Distance between opposing sides of two adjacent hexagonal openings in the mask h: Height of mesa

The invention claimed is:

1. A method for producing a Group III nitride-based compound semiconductor, the method comprising:

thermally treating a main surface of a substrate, the main surface comprising thereon a mesa comprising at least an inclined side surface;

forming an aluminum nitride thin film on the main surface of the substrate comprising the mesa through nitridation under supply of ammonia; and epitaxially growing a Group III nitride-based compound semiconductor selectively on the inclined side surface of the mesa of the substrate such that no epitaxial growth occurs or epitaxial growth proceeds more slowly on surfaces of the mesa other than the inclined side surface than an epitaxial growth rate on the inclined side surface.

2. A method for producing a Group III nitride-based compound semiconductor according to claim 1, wherein the substrate comprises a sapphire substrate comprising an m-plane main surface, the mesa comprises another side surface other than the side surface of the main surface, and a line formed by the another side surface and the main surface is inclined, in the m-plane of the sapphire substrate, from an a-axis toward a c-axis direction by 15° to 90°.

3. A method for producing a Group III nitride-based compound semiconductor according to claim 1, wherein the substrate comprises a sapphire substrate comprising a c-plane main surface, and the mesa comprises another side surface other than the side surface of the main surface.

4. A method for producing a Group III nitride-based compound semiconductor according to claim 2, wherein, among side surfaces of the mesa, one of two side surfaces comprising different normal vectors is covered with a material which does not permit easy epitaxial growth of a Group III nitride-based compound semiconductor.

5. A method for producing a Group III nitride-based compound semiconductor according to claim 3, wherein, among side surfaces of the mesa, one of two side surfaces comprising different normal vectors is covered with a material which does not permit easy epitaxial growth of a Group III nitride-based compound semiconductor.

6. A method for producing a Group III nitride-based compound semiconductor according to claim 2, wherein, among side surfaces of the mesa, one of two side surfaces comprising different normal vectors is treated to include embossment or roughness so that epitaxial growth of Group III nitride-based compound semiconductor on the treated side surface does not proceed easily.

7. A method for producing a Group III nitride-based compound semiconductor according to claim 3, wherein, among side surfaces of the mesa, one of two side surfaces comprising different normal vectors is treated to include embossment or roughness so that epitaxial growth of a Group III nitride-based compound semiconductor on the treated side surfaces does not proceed easily.

8. A method for producing a Group III nitride-based compound semiconductor according to claim 1, wherein mesas are arranged in a strip form as viewed from above.

9. A method for producing a Group III nitride-based compound semiconductor according to claim 1, wherein mesas are arranged in a stripe form as viewed from above.

10. A method for producing a Group III nitride-based compound semiconductor according to claim 1, wherein, in the thermally treating, an aluminum thin film having a thickness of 1 Å to 40 Å is formed through supply of aluminum or an aluminum compound.

11. A method for producing a Group III nitride-based compound semiconductor according to claim 10, wherein the aluminum thin film is formed through supply of trimethylaluminum.

12. A method for producing a Group III nitride-based compound semiconductor according to claim 11, wherein the aluminum thin film is formed in a range from 300° C. to 420° C.

13. A method for producing a Group III nitride-based compound semiconductor according to claim 1, wherein the thermally treating involves heating to a predetermined temperature of 900° C. to 1,200° C. and maintaining the predetermined temperature for 20 minutes or shorter in a hydrogen atmosphere.

14. A method for producing a Group III nitride-based compound semiconductor according to claim 1, wherein the thermally treating does not involve supply of ammonia or a reactive nitrogen compound which can serve as a nitrogen source for a Group III nitride-based compound semiconductor.

15. A method for producing a Group III nitride-based compound semiconductor according to claim 1, wherein the substrate comprises a sapphire substrate comprising an m-plane main surface, and the mesa comprises another side surface other than the side surface of the main surface.

16. A method for producing a Group III nitride-based compound semiconductor according to claim 15, wherein a line formed by said another side surface and the main surface is inclined, in an m-plane of the sapphire substrate, from an a-axis toward a c-axis direction.

17. A method for producing a Group III nitride-based compound semiconductor according to claim 1, wherein the inclined side surface of the mesa has an off-angle of 45° or less from a c-plane of the sapphire substrate.

18. A method for producing a Group III nitride-based compound semiconductor according to claim 17, wherein the epitaxially growing comprises forming a Group III nitride-based compound semiconductor layer comprising an m-plane main surface.

19. A method for producing a Group III nitride-based compound semiconductor according to claim 18, wherein the m-plane main surface is parallel to an a-plane surface of the sapphire substrate.

20. A method for producing a Group III nitride-based compound semiconductor, the method comprising:
    thermally treating an a-plane main surface of a sapphire substrate, the main surface comprising thereon a mesa comprising at least a side surface having an off-angle of 45° or less from a c-plane of the sapphire substrate;
    forming an aluminum nitride thin film on the main surface comprising a mesa through nitridation under supply of ammonia; and
    epitaxially growing a Group III nitride-based compound semiconductor primarily on the side surface of the mesa comprising an off-angle of 45° or less from the c-plane, to thereby form a Group III nitride-based compound semiconductor layer comprising an m-plane main surface which is parallel to the a- plane surface of the sapphire substrate.

21. A method for producing a Group III nitride-based compound semiconductor according to claim 20, wherein, among side surfaces of the mesa, one of two side surfaces comprising different normal vectors is covered with a material which does not permit easy epitaxial growth or a group III nitride-based compound semiconductor.

22. A method for producing a Group III nitride-based compound semiconductor according to claim 20, wherein, among side surfaces of the mesa, one of two side surfaces comprising different normal vectors is treated to include embossment or roughness so that epitaxial growth of a Group III nitride-based compound semiconductor on the treated side surfaces does not proceed easily.

23. A method for producing a Group III nitride-based compound semiconductor according to claim 20, wherein mesas are arranged in a stripe form as viewed from above.

24. A method for producing a Group III nitride-based compound semiconductor according to claim 20, wherein mesas are arranged in a lattice form as viewed from above.

25. A method for producing a Group III nitride-based compound semiconductor according to claim 20, wherein, in the thermally treating, an aluminum thin film having a thickness of 1 Å to 40 Å is formed through supply of aluminum or an aluminum compound.

26. A method for producing a Group III nitride-based compound semiconductor according to claim 25, wherein the aluminum thin film is formed through supply of trimethylaluminum.

27. A method for producing a Group III nitride-based compound semiconductor according to claim 26, wherein the aluminum thin film is formed in a range from 300° C. to 420° C.

28. A method for producing a Group III nitride-based compound semiconductor according to claim 20, wherein the thermally treating involves heating to a predetermined temperature of 900° C. to 1,200° C. and maintaining the predetermined temperature for 20 minutes or shorter in a hydrogen atmosphere.

29. A method for producing a Group III nitride-based compound semiconductor according to claim 20, wherein the thermally treating does not involve supply of ammonia or a reactive nitrogen compound which can serve as a nitrogen source for a Group III nitride-based compound semiconductor.

* * * * *

UNITED STATES PATENT AND TRADEMARK OFFICE
CERTIFICATE OF CORRECTION

PATENT NO. : 8,518,806 B2
APPLICATION NO. : 12/734685
DATED : August 27, 2013
INVENTOR(S) : Koji Okuno et al.

It is certified that error appears in the above-identified patent and that said Letters Patent is hereby corrected as shown below:

In the Claims

Col. 22, line 55 (Claim 8, line 3) change "in a strip form" to "in a lattice form".

Signed and Sealed this
Fifth Day of November, 2013

Teresa Stanek Rea
*Deputy Director of the United States Patent and Trademark Office*